US012707624B2

(12) United States Patent
Yamazaki et al.

(10) Patent No.: US 12,707,624 B2
(45) Date of Patent: Aug. 11, 2026

(54) MANUFACTURING METHOD OF SEMICONDUCTOR DEVICE

(71) Applicant: Semiconductor Energy Laboratory Co., Ltd., Atsugi (JP)

(72) Inventors: Shunpei Yamazaki, Setagaya (JP); Motomu Kurata, Isehara (JP); Tsutomu Murakawa, Isehara (JP); Ryo Arasawa, Isehara (JP); Kunihiro Fukushima, Isehara (JP); Yasumasa Yamane, Atsugi (JP); Shinya Sasagawa, Chigasaki (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 493 days.

(21) Appl. No.: 18/015,118

(22) PCT Filed: Aug. 5, 2021

(86) PCT No.: PCT/IB2021/057177

§ 371 (c)(1),
(2) Date: Jan. 9, 2023

(87) PCT Pub. No.: WO2022/038447

PCT Pub. Date: Feb. 24, 2022

(65) Prior Publication Data

US 2023/0262952 A1 Aug. 17, 2023

(30) Foreign Application Priority Data

Aug. 19, 2020 (JP) ................................ 2020-138545

(51) Int. Cl.
*H10B 12/00* (2023.01)

(52) U.S. Cl.
CPC .................................. *H10B 12/01* (2023.02)

(58) Field of Classification Search
CPC .......... H10B 12/0335; H01L 21/02266; H01L 21/0228
See application file for complete search history.

(56) References Cited

U.S. PATENT DOCUMENTS 8,455,868 B2 6/2013 Yamazaki et al.
8,547,771 B2 10/2013 Koyama
(Continued)

FOREIGN PATENT DOCUMENTS

CN 108886021 A 11/2018
JP 2011-151383 A 8/2011
(Continued)

OTHER PUBLICATIONS

International Search Report (Application No. PCT/IB2021/057177) Dated Nov. 16, 2021.
(Continued)

*Primary Examiner* — Edward Chin
(74) *Attorney, Agent, or Firm* — Eric J. Robinson; Robinson Intellectual Property Law Office, P.C.

(57) ABSTRACT

A semiconductor device with a small variation in transistor characteristics can be provided. A step of forming an opening in a structure body including an oxide semiconductor device to reach the oxide semiconductor device, a step of embedding a first conductor in the opening, a step of forming a second conductor in contact with a top surface of the first conductor, a step of forming a first barrier insulating film by a sputtering method to cover the structure body, the first conductor, and the second conductor, and a step of forming a second barrier insulating film over the first barrier insulating film by an ALD method are included. The first barrier insulating film and the second barrier insulating film each have a function of inhibiting hydrogen diffusion.

19 Claims, 16 Drawing Sheets

(56) References Cited

U.S. PATENT DOCUMENTS

| | | | | |
|---|---|---|---|---|
| 8,551,824 | B2 | 10/2013 | Yamazaki et al. | |
| 8,552,425 | B2 | 10/2013 | Ichijo et al. | |
| 8,853,684 | B2 | 10/2014 | Endo et al. | |
| 9,947,777 | B2 | 4/2018 | Yamazaki et al. | |
| 9,978,774 | B2 | 5/2018 | Yamazaki et al. | |
| 10,367,005 | B2 | 7/2019 | Yamazaki et al. | |
| 10,741,679 | B2 | 8/2020 | Yamazaki et al. | |
| 10,957,801 | B2 | 3/2021 | Nakazawa et al. | |
| 11,211,461 | B2 | 12/2021 | Yamazaki et al. | |
| 11,545,578 | B2 | 1/2023 | Yamazaki et al. | |
| 2014/0001467 | A1 | 1/2014 | Yamazaki et al. | |
| 2017/0236831 | A1* | 8/2017 | Kim | H10B 41/27 |
| 2017/0236839 | A1* | 8/2017 | Yamazaki | H10D 87/00 257/43 |
| 2017/0309732 | A1 | 10/2017 | Yamazaki et al. | |
| 2019/0139783 | A1 | 5/2019 | Yamazaki et al. | |
| 2020/0212185 | A1 | 7/2020 | Yamazaki et al. | |
| 2022/0013667 | A1 | 1/2022 | Nakada et al. | |
| 2022/0102505 | A1 | 3/2022 | Yamazaki et al. | |
| 2022/0173228 | A1 | 6/2022 | Yamazaki et al. | |
| 2022/0173249 | A1 | 6/2022 | Matsuzaki et al. | |
| 2022/0223721 | A1 | 7/2022 | Yamazaki et al. | |
| 2022/0376113 | A1 | 11/2022 | Yamazaki et al. | |
| 2023/0113593 | A1 | 4/2023 | Yamazaki et al. | |

FOREIGN PATENT DOCUMENTS

| | | | |
|---|---|---|---|
| JP | 2012-257187 | A | 12/2012 |
| JP | 2017-147443 | A | 8/2017 |
| JP | 2017-199900 | A | 11/2017 |
| JP | 2020-120107 | A | 8/2020 |
| JP | 2020-123612 | A | 8/2020 |
| KR | 2018-0124032 | A | 11/2018 |
| KR | 2018-0134919 | A | 12/2018 |
| KR | 2020-0083211 | A | 7/2020 |
| TW | 201735130 | | 10/2017 |
| WO | WO-2017/137864 | | 8/2017 |
| WO | WO-2017/182910 | | 10/2017 |

OTHER PUBLICATIONS

Written Opinion (Application No. PCT/IB2021/057177) Dated Nov. 16, 2021.

* cited by examiner

FIG. 6A
| Amorphous | Crystalline | Crystal |
|---|---|---|
| ・completely amorphous | ・CAAC<br>・nc<br>・CAC<br>excluding single crystal and poly crystal | ・single crystal<br>・poly crystal |
Intermediate state
New crystalline phase
FIG. 6B
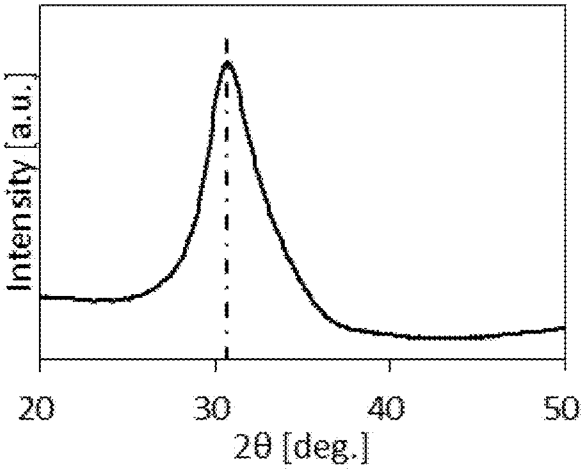
FIG. 6C
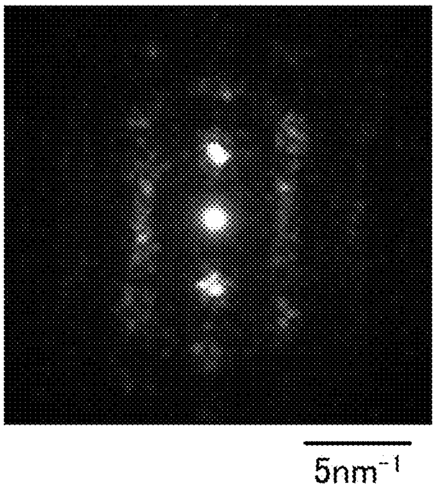

1471

1472

1473

1474

1475

1476

1477

1478

MANUFACTURING METHOD OF SEMICONDUCTOR DEVICE

TECHNICAL FIELD

One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed to be mainly used for LSI, CPUs, memories, and the like. A CPU is an assembly of semiconductor elements each including a semiconductor integrated circuit (including at least a transistor and a memory) which is taken out from a semiconductor wafer and provided with an electrode serving as a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a semiconductor thin film applicable to the transistor and further, an oxide semiconductor has been attracting attention as another material.

It is known that a transistor using an oxide semiconductor has an extremely low leakage current in a non-conduction state. For example, a low-power-consumption CPU utilizing a feature of a low leakage current of the transistor using an oxide semiconductor is disclosed (Patent Document 1). Furthermore, for example, a storage device that can retain stored contents for a long time by utilizing a feature of a low leakage current of the transistor using an oxide semiconductor is disclosed (Patent Document 2).

In recent years, demand for an integrated circuit with higher density has risen with reductions in size and weight of electronic devices. Furthermore, the productivity of a semiconductor device including an integrated circuit is desired to be improved.

REFERENCE

Patent Document

[Patent Document 1] Japanese Published Patent Application No. 2012-257187
[Patent Document 2] Japanese Published Patent Application No. 2011-151383

Non-Patent Document

SUMMARY OF THE INVENTION

Problems to be Solved by the Invention

An object of one embodiment of the present invention is to provide a semiconductor device with a small variation in transistor characteristics. Another object of one embodiment of the present invention is to provide a semiconductor device with favorable electric characteristics. Another object of one embodiment of the present invention is to provide a semiconductor device with favorable reliability. Another object of one embodiment of the present invention is to provide a semiconductor device with a high on-state current. Another object of one embodiment of the present invention is to provide a semiconductor device with a high field-effect mobility. Another object of one embodiment of the present invention is to provide a semiconductor device with favorable frequency characteristics. Another object of one embodiment of the present invention is to provide a semiconductor device that can be miniaturized or highly integrated. Another object of one embodiment of the present invention is to provide a semiconductor device with low power consumption. Another object of one embodiment of the present invention is to provide a method for manufacturing any of the above semiconductor devices.

Note that the description of these objects does not preclude the existence of other objects. In one embodiment of the present invention, there is no need to achieve all these objects. Other objects are apparent from and can be derived from the description of the specification, the drawings, the claims, and the like.

Means for Solving the Problems

One embodiment of the present invention is a method for manufacturing a semiconductor device including a step of forming an opening in a structure body including an oxide semiconductor device to reach the oxide semiconductor device, a step of embedding a first conductor in the opening, a step of forming a second conductor in contact with a top surface of the first conductor, a step of forming a first barrier insulating film by a sputtering method to cover the structure body, the first conductor, and the second conductor, and a step of forming a second barrier insulating film over the first barrier insulating film by an ALD method. The first barrier insulating film and the second barrier insulating film each have a function of inhibiting hydrogen diffusion.

In the above embodiment, the first barrier insulating film is preferably silicon nitride. In the above embodiment, the second barrier insulating film is preferably silicon nitride. In the above embodiment, the hydrogen concentration in the first barrier insulating film is preferably lower than the hydrogen concentration in the second barrier insulating film.

In the above embodiment, the second barrier insulating film is preferably formed by a PEALD method. In the above embodiment, it is preferable that a precursor not containing an organic substance be used for the formation of the second barrier insulating film.

In the above embodiment, before a step of forming the structure body, a step of forming a third barrier insulating film by an ALD method and a step of forming a fourth barrier insulating film over the third barrier insulating film by a sputtering method may be included, and the third barrier insulating film and the fourth barrier insulating film may have a function of inhibiting hydrogen diffusion.

In the above embodiment, the third barrier insulating film is preferably silicon nitride. In the above embodiment, the fourth barrier insulating film is preferably silicon nitride. In the above embodiment, the hydrogen concentration in the fourth barrier insulating film is preferably lower than the hydrogen concentration in the third barrier insulating film.

In the above embodiment, the third barrier insulating film is preferably formed by a PEALD method. In the above embodiment, it is preferable that a precursor not containing an organic substance be used for the formation of the third barrier insulating film.

In the above embodiment, an oxide semiconductor film included in the oxide semiconductor device is preferably formed by a sputtering method using a target including one or more of In, Ga, and Zn.

Effect of the Invention

According to one embodiment of the present invention, a semiconductor device with a small variation in transistor characteristics can be provided. According to another embodiment of the present invention, a semiconductor device having favorable electrical characteristics can be provided. According to another embodiment of the present invention, a semiconductor device with favorable reliability can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with favorable frequency characteristics can be provided. According to another embodiment of the present invention, a semiconductor device that can be miniaturized or highly integrated can be provided. According to another embodiment of the present invention, a semiconductor device with low power consumption can be provided. According to another embodiment of the present invention, a method for manufacturing any of the above semiconductor devices can be provided.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 6A is a diagram showing the classification of crystal structures of IGZO. FIG. 6B is a graph showing an XRD spectrum of a CAAC-IGZO film. FIG. 6C is an image showing a nanobeam electron diffraction pattern of a CAAC-IGZO film.

MODE FOR CARRYING OUT THE INVENTION

Figure 1A:
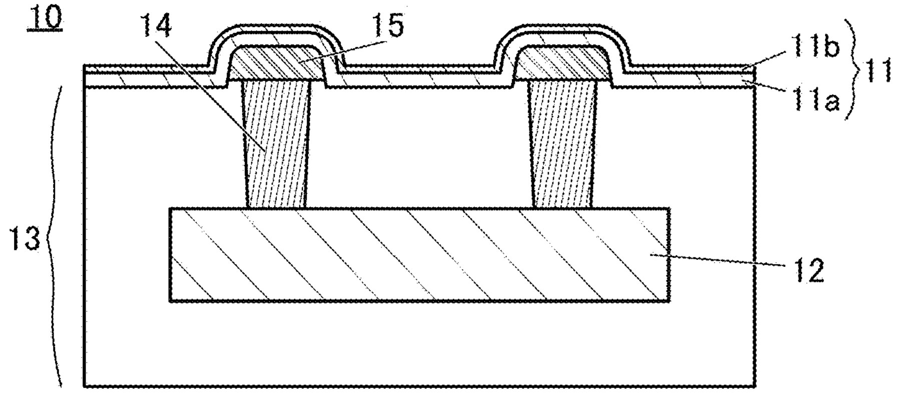
FIG. 1A to FIG. 1C are schematic diagrams of a semiconductor device of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relation between components with reference to drawings. The positional relationship between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of current is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to a channel length direction in a region where a semiconductor (or a portion where current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases or the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term “insulator” can be replaced with an insulating film or an insulating layer. Furthermore, the term “conductor” can be replaced with a conductive film or a conductive layer. Moreover, the term “semiconductor” can be replaced with a semiconductor film or a semiconductor layer.

In this specification and the like, “parallel” indicates a state where two straight lines are placed at an angle greater than or equal to −10° and less than or equal to 10°. Accordingly, the case where the angle is greater than or equal to −5° and less than or equal to 5° is also included. Furthermore, “substantially parallel” indicates a state where two straight lines are placed at an angle greater than or equal to −30° and less than or equal to 30°. Moreover, “perpendicular” indicates a state where two straight lines are placed at an angle greater than or equal to 800 and less than or equal to 100°. Accordingly, the case where the angle is greater than or equal to 85° and less than or equal to 95° is also included. Furthermore, “substantially perpendicular” indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, “normally off” means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, an example of a semiconductor device of one embodiment of the present invention and a manufacturing method thereof will be described with reference to FIG. 1A to FIG. 3C.

<Structure Example of Semiconductor Device>

FIG. 1A is a diagram schematically showing a semiconductor device 10 of one embodiment of the present invention. The semiconductor device 10 of one embodiment of the present invention includes an element layer 13 formed over a substrate (not illustrated), an oxide semiconductor element 12 included in the element layer 13, a conductor 14 positioned in an opening formed in the element layer 13, a conductor 15 positioned over the conductor 14, an insulator 11*a* positioned to cover the element layer 13, the conductor 14, and the conductor 15, and an insulator 11*b* over the insulator 11*a*. In this specification and the like, the oxide semiconductor element is referred to as an oxide semiconductor device in some cases. In this specification and the like, the element layer 13 is referred to as a structure body in some cases.

The element layer 13 includes an interlayer insulating film stacked over or below the oxide semiconductor element 12. As the interlayer insulating film, for example, silicon oxide, silicon oxynitride, silicon oxide to which fluorine is added, silicon oxide to which carbon is added, silicon oxide to which carbon and nitrogen are added, porous silicon oxide, or the like can be used. Note that although FIG. 1A illustrates a state where the element layer 13 includes one oxide semiconductor element 12, the present invention is not limited thereto. The element layer 13 may include a plurality of oxide semiconductor elements 12.

The conductor 14 is positioned in the opening formed in the interlayer insulating film of the element layer 13. The opening reaches the oxide semiconductor element 12, so that the conductor 14 is electrically connected to the oxide semiconductor element 12. In other words, the conductor 14 serves as a plug electrically connecting the conductor 15 to the oxide semiconductor element 12. For example, as the conductor 14, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. Tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, and the like are preferable, for example, because they are conductive materials that are not easily oxidized or materials that maintain the conductivity even when absorbing oxygen.

The conductor 15 is provided in contact with the top surface of the conductor 14. A portion of the conductor 15 which does not overlap with the conductor 14 is in contact with an interlayer insulating film of the uppermost layer in the element layer 13. The conductor 15 functions as a wiring, an electrode, a terminal, or the like that is electrically connected to the oxide semiconductor element 12. The conductor 15 can be formed using a conductive material that can be used for the conductor 14. Note that although two conductors 14 and two conductors 15 are illustrated in FIG. 1A, one embodiment of the present invention is not limited to this structure. The numbers of the conductors 14 and the conductors 15 can be appropriately set depending on the structure of the oxide semiconductor element 12.

The oxide semiconductor element 12 includes at least one of circuit elements such as a switch, a transistor, a capacitor, an inductor, a resistor, and a diode. Furthermore, at least part of the circuit elements is provided with an oxide semiconductor film. For example, a transistor including a channel formation region in an oxide semiconductor film can be provided as the oxide semiconductor element 12. Note that specific examples of the oxide semiconductor element 12 and the like will be described in the following embodiment later.

As the oxide semiconductor film, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). An In—Ga oxide, an In—Zn oxide, or an indium oxide may be used as the oxide semiconductor film.

The above oxide semiconductor film has a band gap greater than or equal to 2 eV, preferably greater than or equal to 2.5 eV. With use of an oxide semiconductor film having such a wide band gap, the off-state current of the transistor can be reduced.

The oxide semiconductor film preferably has crystallinity. It is particularly preferable to use a CAAC-OS (c-axis aligned crystalline oxide semiconductor) for the oxide semiconductor film.

The CAAC-OS is a metal oxide having a dense structure with high crystallinity and a small amount of impurities and defects (oxygen vacancy ($V_O$) or the like). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities in the CAAC-OS can be further reduced.

On the other hand, a clear crystal grain boundary cannot be observed in the CAAC-OS; thus, it can be said that a reduction in electron mobility due to the crystal grain boundary is less likely to occur. Thus, an oxide semiconductor film including the CAAC-OS is physically stable. Therefore, the oxide semiconductor film including the CAAC-OS is resistant to heat and has high reliability.

An oxide semiconductor film with a low carrier concentration is preferably used for a channel formation region of the transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Examples of impurities in the oxide semiconductor include hydrogen, nitrogen, an alkali metal, an alkaline earth metal, iron, nickel, and silicon.

In particular, hydrogen contained in the oxide semiconductor film reacts with oxygen bonded to a metal atom to be water, and thus sometimes causes formation of an oxygen vacancy ($V_O$) in the oxide semiconductor film. In some cases, a defect where hydrogen enters an oxygen vacancy (hereinafter, sometimes referred to as $V_OH$) functions as a donor and generates an electron serving as a carrier. In other cases, bonding of part of hydrogen to oxygen bonded to a metal atom generates electrons serving as carriers. Thus, a transistor using an oxide semiconductor film containing a large amount of hydrogen tends to have normally on characteristics (characteristics in which, even when no voltage is applied to the gate electrode, the channel exists and current flows through the transistor). Uneven in-plane distribution of hydrogen concentration may cause variation of electrical characteristics of transistors according to the distribution of hydrogen concentration. Moreover, hydrogen in an oxide semiconductor film is easily transferred by a stress such as heat or an electric field; thus, a large amount of hydrogen in an oxide semiconductor film might reduce the reliability of a transistor. Thus, impurities, oxygen vacancies, and $V_OH$ are preferably reduced as much as possible in the region of the oxide semiconductor film where a channel is formed. In other words, it is preferable that the region of the oxide semiconductor film where a channel is formed have a reduced carrier concentration and be of an i-type (intrinsic) or substantially i-type.

However, even when an oxide semiconductor film in which the amount of hydrogen contained is reduced is formed, hydrogen is diffused into the oxide semiconductor film from the outside thereof in some cases. For example, in the case where an organic resin such as polyimide is provided over the oxide semiconductor element 12, hydrogen contained in the organic resin may be diffused.

In one embodiment of the present invention, the insulator 11*a* and the insulator 11*b* each of which functions as a barrier insulating film blocking impurities such as hydrogen are provided over the element layer 13 and the conductor 15. With the insulator 11*a* and the insulator 11*b* having such a function, the amount of impurities such as hydrogen diffusing into the oxide semiconductor film from above the element layer 13 can be reduced. Furthermore, the insulator 11*a* and the insulator 11*b* are provided to cover not only the element layer 13 but also the conductor 15 functioning as a wiring, whereby the amount impurities such as hydrogen diffusing into the oxide semiconductor film through the conductor 15 and the conductor 14 can be reduced. Hereinafter, the insulator 11*a* and the insulator 11*b* are collectively referred to as an insulator 11, in some cases.

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

The insulator 11 is preferably an insulator having a function of inhibiting diffusion of hydrogen as described above, and preferably has lower permeability of hydrogen than at least one of interlayer insulating films included in the element layer 13. For the insulator 11, aluminum oxide, magnesium oxide, hafnium oxide, gallium oxide, indium gallium zinc oxide, silicon nitride, silicon nitride oxide, or the like can be used, for example. In particular, silicon nitride which has a high hydrogen barrier property is preferably used.

The insulator 11*a* is positioned in contact with the top surface of the uppermost interlayer insulating film of the element layer 13 and the top surface and side surface of the conductor 15. When the misaligned pattern of the conductor 15 or the like occurs, the insulator 11*a* is in contact with part of the conductor 14 in some cases. Thus, when the insulator 11*a* itself has a high hydrogen concentration, there is a risk of hydrogen diffusion into the oxide semiconductor element 12 through the interlayer insulating film, the conductor 14, or the conductor 15.

Thus, the hydrogen concentration in the insulator 11*a* is preferably low. The hydrogen concentration of the insulator 11*a* is preferably lower than that of at least one of the interlayer insulating films included in the element layer 13 and further preferably lower than that of the insulator 11*b*. Therefore, it is preferable to form the insulator 11*a* by a method without using a gas containing hydrogen as a deposition gas. For example, the insulator 11*a* may be formed by a sputtering method.

Since the insulator 11*a* is formed to cover the conductor 15, unevenness in the base of the insulator 11*a* is relatively significant, and there is a risk of forming a pinhole, disconnection, or the like in the insulator 11*a*. In such a case, the pinhole, the disconnection, or the like formed in the insulator 11*a* may serve as a path through which hydrogen diffuses into the element layer 13.

Thus, it is preferable that the coverage with the insulator 11*b* be better than that with the insulator 11*a*. With such a structure, even when a pinhole, disconnection, or the like is formed in the insulator 11*a*, the insulator 11*b* covers the pinhole or the disconnection and accordingly can inhibit the entry of hydrogen.

The insulator 11*b* is preferably deposited by a method providing a film with good coverage, such as an atomic layer deposition (ALD: Atomic Layer Deposition) method. In particular, a PEALD (Plasma Enhanced ALD) method which enables a film to be formed at a relatively low temperature is preferably used. In the film deposition by a PEALD method, a precursor not containing an organic substance is preferably used. With such a method, the hydrogen concentration of the insulator 11*b* can be reduced.

Providing such an insulator 11 enables a reduction in the amount of hydrogen diffusing into the element layer 13 from the above the insulator 11 and from the insulator 11 itself, whereby the hydrogen concentration in the channel formation region of the oxide semiconductor element 12 can be reduced. Accordingly, a semiconductor device with small variations in transistor characteristics can be provided. A semiconductor device with favorable reliability can also be provided. A semiconductor device having favorable electrical characteristics can be provided.

Figure 1B:
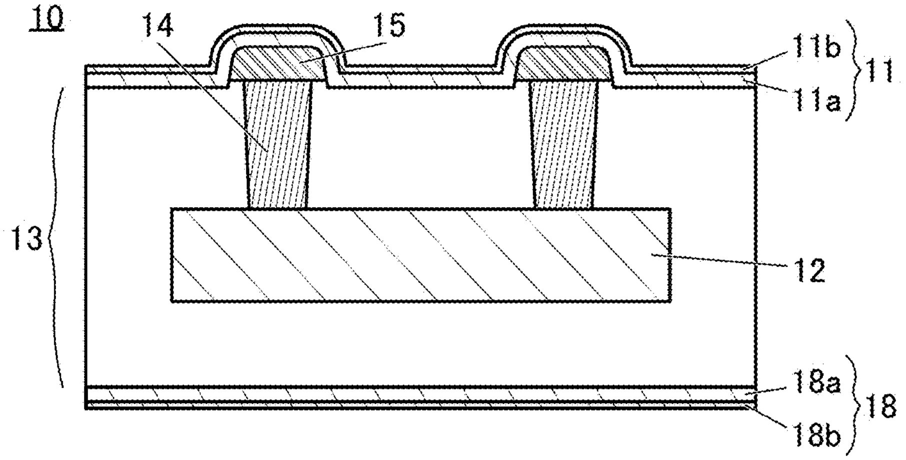

Although FIG. 1A illustrates a structure where the insulator 11 functioning as a barrier insulating film is provided over the element layer 13, the present invention is not limited thereto. As illustrated in FIG. 1B, an insulator 18 functioning as a barrier insulating film may be provided below the element layer 13.

The insulator 18 has a stacked structure including an insulator 18*b* and an insulator 18*a* over the insulator 18*b*. Here, a barrier insulating film that can be used for the insulator 11*a* is preferably used as the insulator 18*a*, and a barrier insulating film that can be used for the insulator 11*b* is preferably used as the insulator 18*b*. In other words, in the stacked structure of the insulator 18, insulators corresponding to those in the insulator 11 are preferably inverted vertically.

In such a stacked structure, the insulator 18*a* in contact with the interlayer insulating film at the lower part of the element layer 13 has a reduced hydrogen concentration like the insulator 11*a*, and thus, the amount of hydrogen diffusing from the insulator 18 itself into the interlayer insulating film can be reduced. Even when the insulator 18 has an uneven base and a pinhole or disconnection is formed in the insulator 18*a*, the insulator 18*b* blocks the pinhole or the disconnection, so that the entry of hydrogen from below the element layer 13 can be inhibited.

Figure 1C:
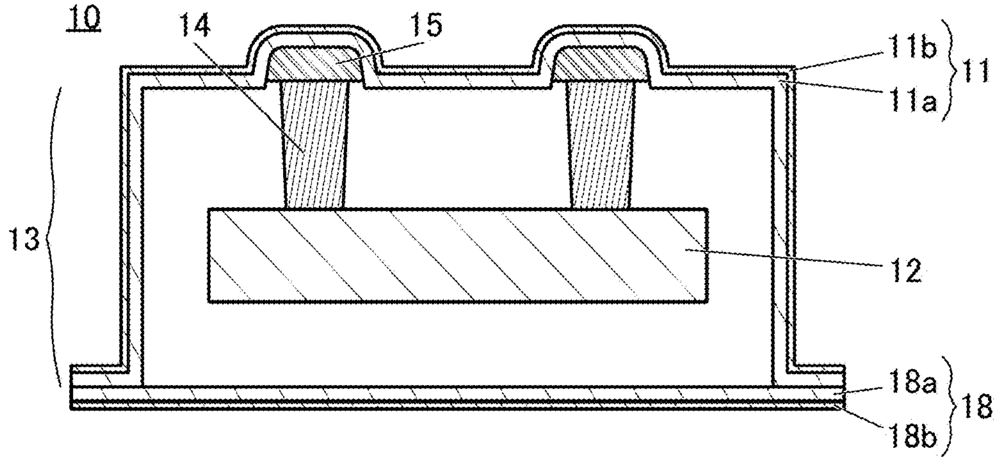

As illustrated in FIG. 1C, the insulator 11 may have a structure in which the insulator 11*a* is in contact with the side surface of the element layer 13. In addition, the insulator 11*a* may be in contact with the insulator 18*a* in a region where the insulator 11*a* does not overlap with the element layer 13. In this case, the region where the insulator 11*a* is in contact with the insulator 18*a* is preferably formed to surround the element layer 13. With such a structure, the amount of hydrogen diffusing into the element layer 13 from the outside can be blocked not only at the top and bottom surfaces of the element layer 13 but also the side surface thereof.

<Manufacturing Method of Semiconductor Device>

Next, a method for manufacturing the semiconductor device 10 of one embodiment of the present invention illustrated in FIG. 1A is described with reference to FIG. 2A to FIG. 3C.

Note that in this specification and the like, an insulating material for forming an insulator, a conductive material for forming a conductor or a semiconductor material for forming a semiconductor can be formed as appropriate by a sputtering method, a chemical vapor deposition (CVD) method, a molecular beam epitaxy (MBE) method, a pulsed laser deposition (PLD) method, an ALD method, or the like.

Examples of the sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, and the like can be used.

A CVD method and an ALD method are different from a sputtering method in which particles ejected from a target or the like are deposited. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be deposited depending on the flow rate ratio of the source gases. For example, by a CVD method, by changing the flow rate ratio of the source gases during the deposition, a film in which the composition is continuously changed can be deposited. In the case where the film is deposited while the flow rate ratio of the source gases is changed, as compared to the case where the film is deposited using a plurality of deposition chambers, the time taken for the deposition can be shortened because the time taken for transfer and pressure adjustment is omitted. Thus, the productivity of the semiconductor device can be increased in some cases.

By an ALD method, a film with a certain composition can be deposited by concurrently introducing a plurality kinds of different precursors or controlling the cycle number of each of the plurality kinds of different precursors.

First, a substrate (not illustrated) is prepared, and the element layer 13 including the oxide semiconductor element 12 is formed over the substrate. The interlayer insulating film of the element layer 13 can be deposited by a sputtering method, a CVD method, an MBE method, a PLD method, an ALD method, or the like. A silicon oxide film may be deposited by a sputtering method as the insulating film, for example.

Figure 2A:
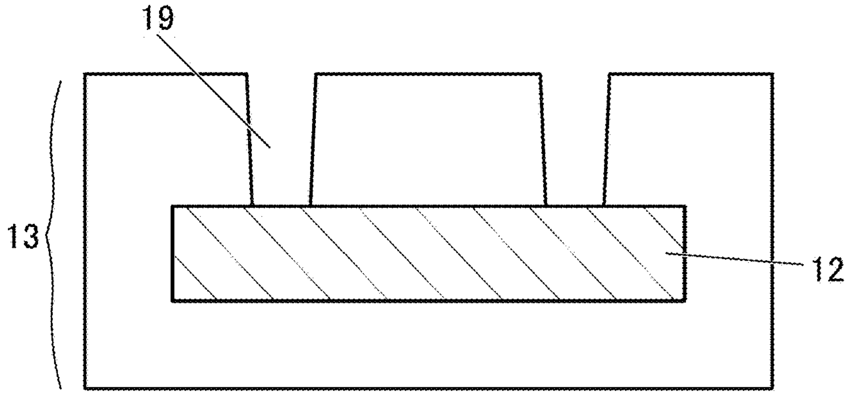
FIG. 2A to FIG. 2C are schematic diagrams illustrating a manufacturing method of a semiconductor device of one embodiment of the present invention.

Next, openings 19 reaching the oxide semiconductor element 12 are formed in the interlayer insulating film of the element layer 13 (see FIG. 2A). The openings can be formed by a lithography method. Wet etching can be used for the formation of the openings; however, dry etching is preferably used for microfabrication.

Figure 2B:
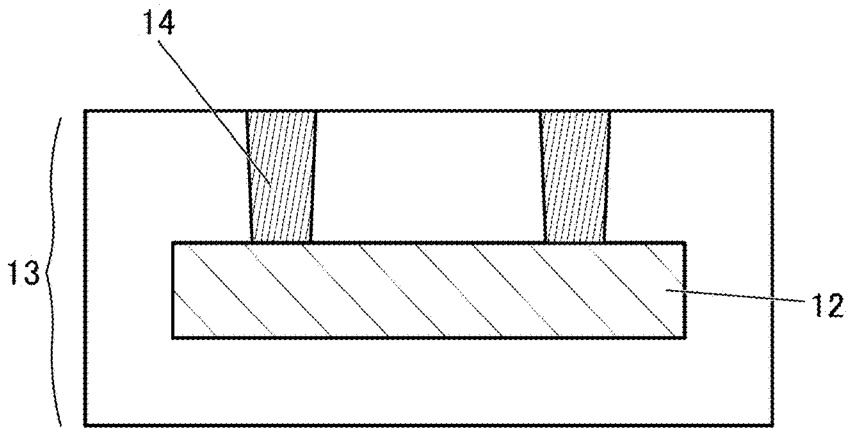

Next, the conductor 14 is embedded in the openings 19 (see FIG. 2B). A conductive film that can be used for the conductor 14 is formed to fill the openings 19, and chemical mechanical polishing (CMP) is performed on the conductive film, so that the conductor 14 is formed. The conductive film can be formed by a sputtering method, a CVD method, an MBE method, a PLD method, an ALD method, or the like.

CMP treatment is performed on the conductive film until the top surface of the uppermost interlayer insulating film of the element layer 13 is exposed, whereby the conductive film remains only in the openings 19, and the conductor 14 with a flat top surface can be formed. Note that the top surface of the interlayer insulating film is partly removed by the CMP treatment in some cases.

Figure 2C:
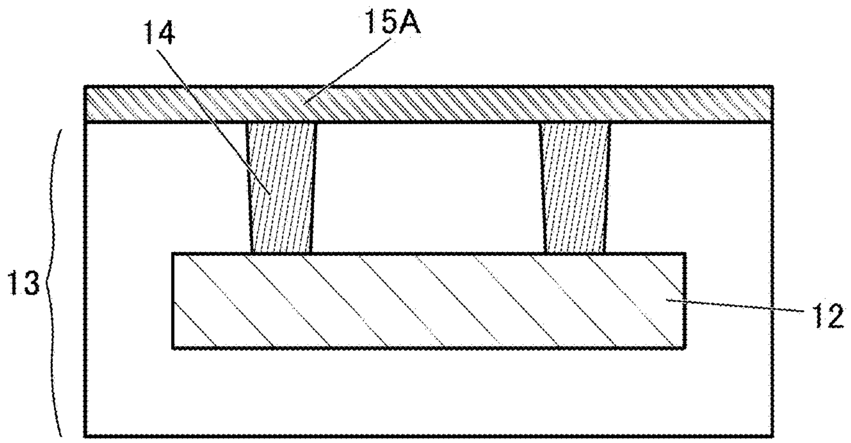

Next, a conductive film 15A is formed to cover the element layer 13 and the conductor 14 (see FIG. 2C). For the conductive film 15A, a conductive film that can be used for the above conductor 14 can be used. The conductive film 15A can be deposited by a sputtering method, a CVD method, an MBE method, a PLD method, an ALD method, or the like.

Figure 3A:
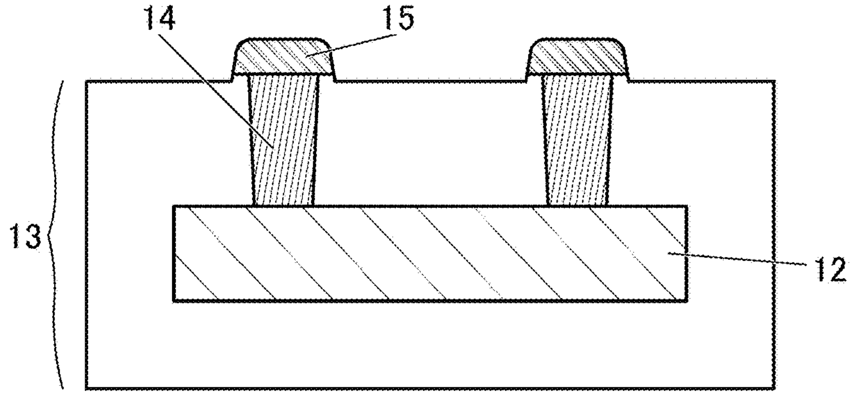
FIG. 3A to FIG. 3C are schematic diagrams illustrating a manufacturing method of a semiconductor device of one embodiment of the present invention.

Next, the conductive film 15A is processed by a lithography method, so that the conductor 15 in contact with the top surface of the conductor 14 is formed (see FIG. 3A). At this time, in a region where an interlayer insulating film of the element layer 13 does not overlap with the conductor 15, part of the interlayer insulating film is removed in some cases. Thus, on the uppermost surface of the element layer 13, the level of a region overlapping with the conductor 14 is higher than that of the other region in some cases.

Figure 3B:
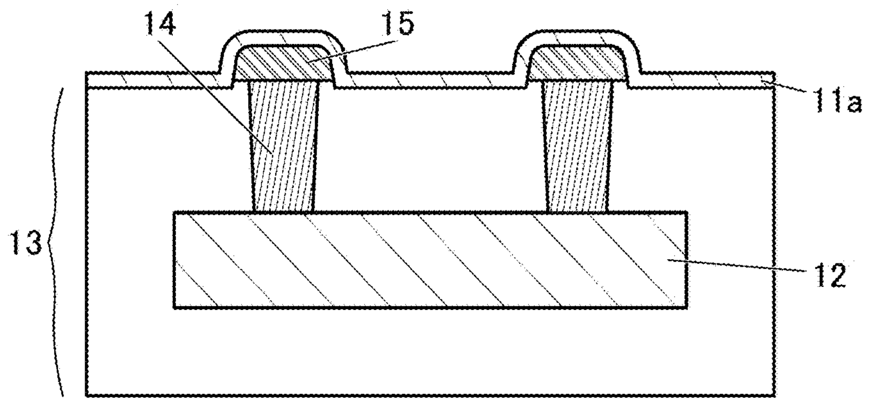

Next, the insulator 11*a* is formed to cover the element layer 13, the conductor 14, and the conductor 15 (see FIG. 3B). For the insulator 11*a*, the above-described insulating material having a hydrogen barrier property may be used, and a nitride containing silicon such as silicon nitride is preferably used. The insulator 11*a* is preferably formed by a sputtering method. By using a sputtering method that does not need to use a molecule containing hydrogen for a deposition gas, the hydrogen concentration in insulator 11*a* can be reduced.

Figure 3C:
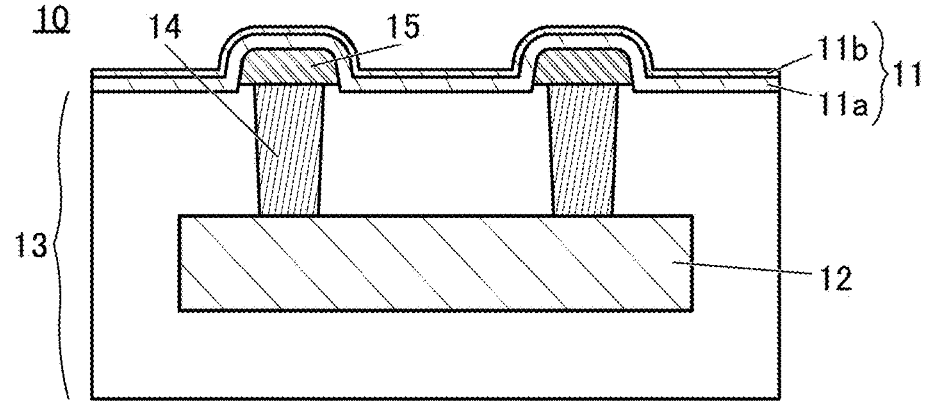

Next, the insulator 11*b* is formed over the insulator 11*a* (see FIG. 3C). For the insulator 11*b*, the above-described insulating material having a hydrogen barrier property may be used, and a nitride containing silicon such as silicon nitride is preferably used. The insulator 11*b* is preferably formed by an ALD method providing a film with good coverage and further preferably formed by a PEALD method.

When the insulator 11*b* is formed by a PEALD method, a precursor not containing an organic substance such as hydrocarbon (hereinafter, referred to as an inorganic precursor) is preferably used. With use of an inorganic precursor for film formation, the hydrogen concentration in the insulator 11*b* can be reduced. As the inorganic precursor, a substance containing silicon is preferably used, and furthermore a halogen element can be contained. In the case where the inorganic precursor contains a halogen element, the halogen element is to be contained in the insulator 11*b* as an impurity in some cases. Note that impurities can be quantified by secondary ion mass spectrometry (SIMS) or X-ray photoelectron spectroscopy (XPS).

Note that an ALD method in the present invention is not limited to the case of using an inorganic precursor, but a precursor containing an organic substance can be used in some cases.

In the case where silicon nitride is deposited by a PEALD method, nitrogen radicals are used as a reactant. Nitrogen radicals can be obtained by making a nitrogen gas into a plasma state. Note that in nitrogen plasma, nitrogen is contained in a state of molecules, radicals, ions, or the like. For example, by applying a high-frequency wave such as RF or a microwave to a nitrogen gas, nitrogen plasma containing nitrogen radicals can be generated. It is preferable that the reactant do not contain hydrogen. In this case, the hydrogen concentration in the insulator 11*b* can be reduced.

Through the above steps, the semiconductor device 10 illustrated in FIG. 1A can be formed.

In the case where the semiconductor device 10 illustrated in FIG. 1B is formed, before the element layer 13 illustrated in FIG. 2A is formed, the insulator 18*b* may be formed and the insulator 18*a* may be formed over the insulator 18*b*. Then, the element layer 13 may be formed over the insulator 18*a*. The insulator 18*a* can be formed in a manner similar to that of the insulator 11*a*. The insulator 18*b* can be formed in a manner similar to that of the insulator 11*b*.

In the case where the semiconductor device 10 illustrated in FIG. 1C is formed, in a manufacturing method of the semiconductor device 10 in FIG. 1B, the element layer 13 may be etched before the insulator 11*a* is formed, so that the insulator 11*a* is provided to cover the side surface of the element layer 13. The top surface of the insulator 18*a* is exposed by the etching, whereby a region where the insulator 11*a* and the insulator 18*a* are in contact with each other can be provided outside the element layer 13. Thus, the element layer 13 can be sealed with the insulator 11 and the insulator 18.

Although the insulator 11 is described as having a stacked structure of the insulator 11*a* and the insulator 11*b* in the above, the present invention is not limited to this structure. For example, when the coverage with the insulator 11*a* is sufficiently good so that a pinhole, disconnection, or the like is not formed, a structure where the insulator 11*b* is not provided but only the insulator 11*a* is provided may be employed. For example, when the hydrogen concentration in the insulator 11*b* is sufficiently low, a structure where the insulator 11*a* is not provided but only the insulator 11*b* is provided may be employed. As for the insulator 18, similarly, a structure where only the insulator 18*a* is provided or a structure where only the insulator 18*b* is provided may be employed.

According to one embodiment of the present invention, a novel semiconductor device can be provided. According to another embodiment of the present invention, a novel manufacturing method of a semiconductor device can be provided. According to another embodiment of the present invention, a semiconductor device with a small variation in transistor characteristics can be provided. According to another embodiment of the present invention, a semiconductor device having favorable electrical characteristics can be provided. According to another embodiment of the present invention, a semiconductor device with favorable reliability can be provided.

At least part of the structure, method, and the like described in this embodiment can be implemented in appropriate combination with any of those in the other embodiments and the other example described in this specification.

Embodiment 2

In this embodiment, a semiconductor device including a transistor 200 will be described as specific examples of the semiconductor device 10 shown in Embodiment 1 with reference to FIG. 4A to FIG. 7C.

<Structure Example of Semiconductor Device>

Figure 4A:
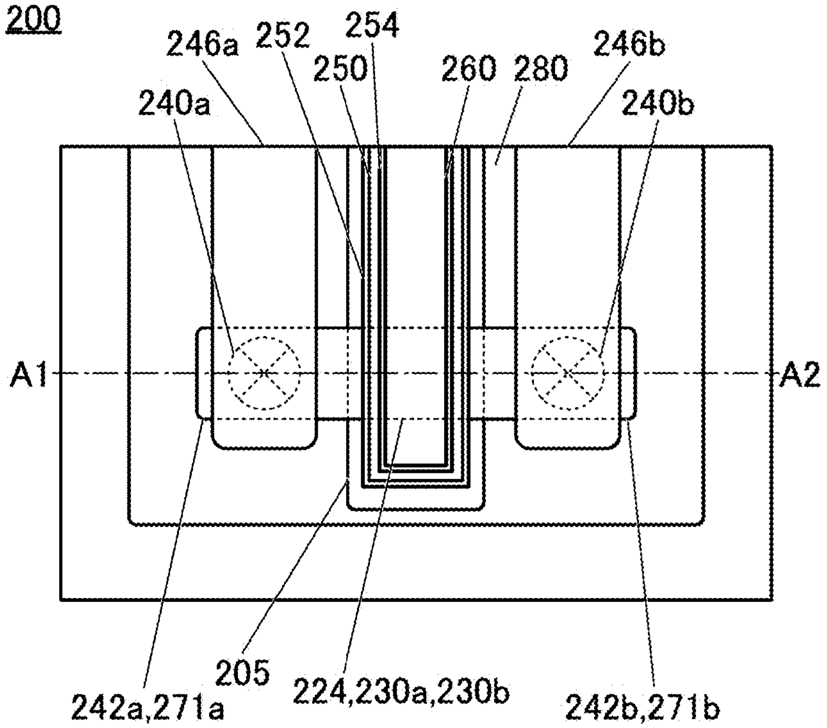
FIG. 4A is a top view of a semiconductor device of one embodiment of the present invention.
Figure 4B:
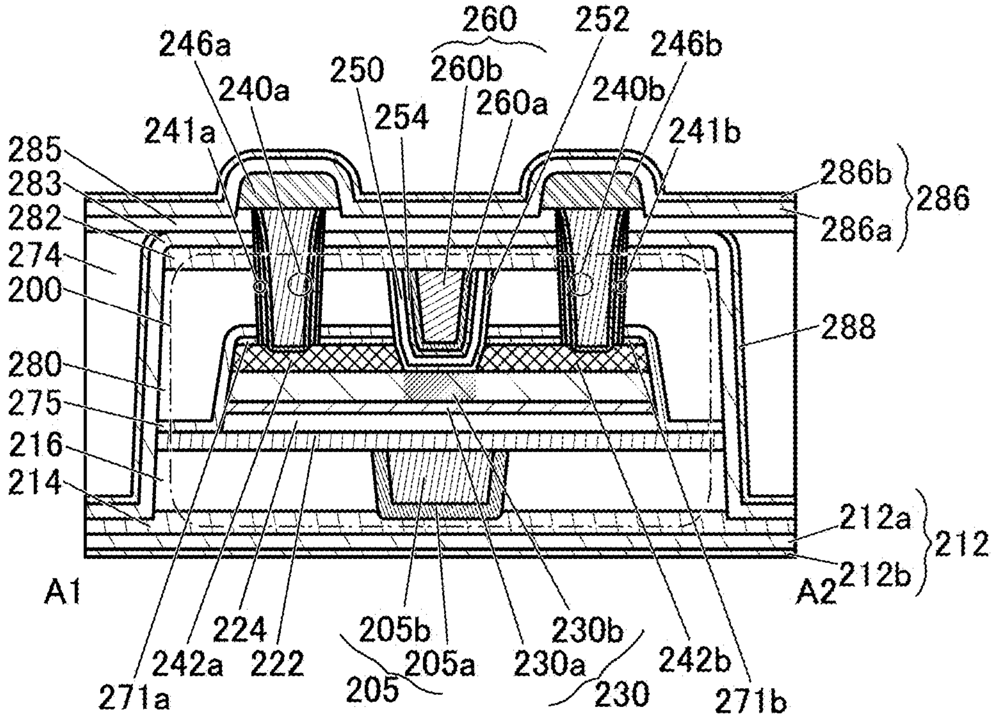
FIG. 4B is a cross-sectional view of the semiconductor device of one embodiment of the present invention.

A structure of a semiconductor device corresponding to the semiconductor device 10 in FIG. 1B is described with reference to FIG. 4A and FIG. 4B. FIG. 4A and FIG. 4B are a top view and a cross-sectional view of the semiconductor device including the transistor 200. FIG. 4A is atop view of the semiconductor device. Here, FIG. 4B is a cross-sectional view of a portion indicated by the dashed-dotted line A1-A2 in FIG. 4A, i.e., a cross-sectional view of the transistor 200 in the channel length direction. For clarity of the drawing, some components are not illustrated in the top view of FIG. 4A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, an insulator 288 over the insulator 283, an insulator 274 over the insulator 288, and an insulator 285 over the insulator 283 and the insulator 274. Here, the insulator 212 preferably has a stacked structure including an insulator 212*b* and an insulator 212*a* over the insulator 212*b*.

The insulator 212, the insulator 214, the insulator 280, the insulator 282, the insulator 283, the insulator 285, and the insulator 274 each function as an interlayer insulating film of the semiconductor device illustrated in FIG. 4A and FIG. 4B. The insulator 283 is in contact with part of the top surface of the insulator 214, the side surface of the insulator 216, the side surface of the insulator 222, the side surface of the insulator 275, the side surface of the insulator 280, and the side surface and the top surface of the insulator 282. In addition, the uppermost portion of the insulator 283, the uppermost portion of the insulator 288, and the uppermost portion of the insulator 274 are substantially aligned with each other.

In addition, the semiconductor device also includes a conductor 240 (a conductor 240*a* and a conductor 240*b*) that is electrically connected to the transistor 200 and functions as a plug. Note that an insulator 241 (an insulator 241*a* and an insulator 241*b*) is provided in contact with a side surface of the conductor 240 functioning as a plug. A conductor 246 (a conductor 246*a* and a conductor 246*b*) electrically connected to the conductor 240 and functioning as a wiring is provided over the insulator 285 and the conductor 240. An insulator 286 is provided to cover the conductor 246 and the insulator 285. The insulator 286 preferably has a stacked structure including an insulator 286*a* and an insulator 286*b* over the insulator 286*a*.

Here, the transistor 200 corresponds to the oxide semiconductor element 12 described in Embodiment 1. The insulator 212 (the insulator 212*a* and the insulator 212*b*) corresponds to the insulator 18 (the insulator 18*a* and the insulator 18*b*) described in Embodiment 1. The conductor 240 corresponds to the conductor 14 described in Embodiment 1. The conductor 246 corresponds to the conductor 15 described in Embodiment 1. The insulator 286 (the insulator 286*a* and the insulator 286*b*) corresponds to the insulator 11 (the insulator 11*a* and the insulator 11*b*) described in Embodiment 1. Therefore, in addition to the description in this embodiment, the description in Embodiment 1 can be referred to.

The insulator 241*a* is provided in contact with an inner wall of an opening formed in the insulator 275, the insulator 280, the insulator 282, the insulator 283, and the insulator 285, and the conductor 240*a* is provided in contact with the side surface of the insulator 241*a*. The insulator 241*b* is provided in contact with an inner wall of an opening formed in the insulator 275, the insulator 280, the insulator 282, the insulator 283, and the insulator 285, and the conductor 240*b* is provided in contact with the side surface of the insulator 241*b*. The insulator 241 has a structure in which a first insulator is provided in contact with the inner wall of the opening and a second insulator is provided on the inner side of the first insulator. The conductor 240 has a structure in which a first conductor is provided in contact with the side surface of the insulator 241 and a second conductor is provided on the inner side of the first conductor. The top surface of the conductor 240 can be substantially level with the top surface of the insulator 285 in a region overlapping with the conductor 246.

Although the first insulator of the insulator 241 and the second insulator of the insulator 241 are stacked in the transistor 200, the present invention is not limited thereto. For example, the insulator 241 may have a single-layer structure or a stacked-layer structure of three or more layers. Although the first conductor of the conductor 240 and the second conductor of the conductor 240 are stacked in the transistor 200, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

[Transistor 200]

As illustrated in FIG. 4A and FIG. 4B, the transistor 200 includes the insulator 216 over the insulator 214, a conductor 205 (a conductor 205*a* and a conductor 205*b*) provided to be embedded in the insulator 214 or the insulator 216, an insulator 222 over the insulator 216 and the conductor 205, an insulator 224 over the insulator 222, an oxide 230*a* over the insulator 224, an oxide 230*b* over the oxide 230*a*, a conductor 242*a* over the oxide 230*b*, an insulator 271*a* over the conductor 242*a*, a conductor 242*b* over the oxide 230*b*, an insulator 271*b* over the conductor 242*b*, an insulator 252 over the oxide 230*b*, an insulator 250 over the insulator 252, an insulator 254 over the insulator 250, a conductor 260 (a conductor 260*a* and a conductor 260*b*) over the insulator 254 and overlapping with part of the oxide 230*b*, and the insulator 275 placed over the insulator 222, the insulator 224, the oxide 230*a*, the oxide 230*b*, the conductor 242*a*, the conductor 242*b*, the insulator 271*a*, and the insulator 271*b*. Here, the insulator 252 is in contact with the top surface of the insulator 222, the side surface of the insulator 224, the side surface of the oxide 230*a*, the side surface and the top surface of the oxide 230*b*, the side surface of the conductor

242, the side surface of the insulator 271, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with the top surfaces of the conductor 260, the insulator 252, the insulator 250, the insulator 254, and the insulator 280.

Hereinafter, the oxide 230*a* and the oxide 230*b* are collectively referred to as the oxide 230 in some cases. The conductor 242*a* and the conductor 242*b* are collectively referred to as the conductor 242 in some cases. The insulator 271*a* and the insulator 271*b* are collectively referred to as the insulator 271 in some cases.

An opening reaching the oxide 230*b* is provided in the insulator 280 and the insulator 275. The insulator 252, the insulator 250, the insulator 254, and the conductor 260 are positioned in the opening. The conductor 260, the insulator 252, the insulator 250, and the insulator 254 are provided between the conductor 242*a* and the conductor 242*b* and between the insulator 271*a* and the insulator 271*b* in the channel length direction of the transistor 200. The insulator 254 includes a region in contact with the side surface of the conductor 260 and a region in contact with the bottom surface of the conductor 260.

The oxide 230 preferably includes the oxide 230*a* placed over the insulator 224 and the oxide 230*b* placed over the oxide 230*a*. Including the oxide 230*a* under the oxide 230*b* makes it possible to inhibit diffusion of impurities into the oxide 230*b* from components formed below the oxide 230*a*.

Although a structure in which two layers, the oxide 230*a* and the oxide 230*b*, are stacked as the oxide 230 in the transistor 200 is described, the present invention is not limited thereto. For example, the oxide 230 may be provided as a single layer of the oxide 230*b* or to have a stacked-layer structure of three or more layers, or the oxide 230*a* and the oxide 230*b* may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242*a* functions as one of a source and a drain, and the conductor 242*b* functions as the other of the source and the drain. At least part of a region of the oxide 230 overlapping with the conductor 260 functions as a channel formation region.

Figure 5A:
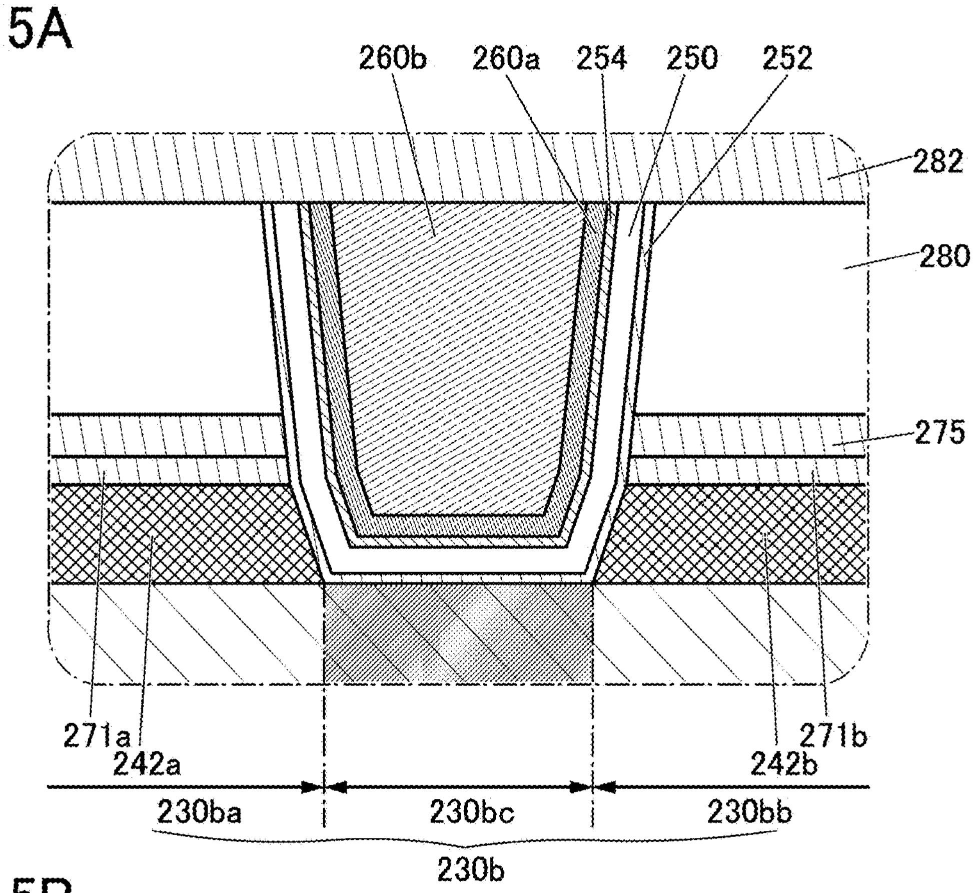
FIG. 5A and FIG. 5B are cross-sectional views of a semiconductor device of one embodiment of the present invention.

Here, FIG. 5A shows an enlarged view of the vicinity of the channel formation region in FIG. 4B. Supply of oxygen to the oxide 230*b* forms the channel formation region in a region between the conductor 242*a* and the conductor 242*b*. As illustrated in FIG. 5A, the oxide 230*b* includes a region 230*bc* functioning as the channel formation region of the transistor 200 and a region 230*ba* and a region 230*bb* that are provided to sandwich the region 230*bc* and function as a source region and a drain region. At least part of the region 230*bc* overlaps with the conductor 260. In other words, the region 230*bc* is provided between the conductor 242*a* and the conductor 242*b*. The region 230*ba* is provided to overlap with the conductor 242*a*, and the region 230*bb* is provided to overlap with the conductor 242*b*.

The region 230*bc* functioning as the channel formation region has a smaller amount of oxygen vacancies or a lower impurity concentration than those of the regions 230*ba* and 230*bb*, in other words, the region 230*bc* is a high-resistance region with a low carrier concentration. Thus, the region 230*bc* can be regarded as being i-type (intrinsic) or substantially i-type. Performing microwave treatment in an atmosphere containing oxygen facilitates formation of the region 230*bc*, for example. Here, the microwave treatment refers to, for example, treatment using an apparatus including a power source that generates high-density plasma with use of a microwave. Note that in this specification and the like, a microwave refers to an electromagnetic wave having a frequency from 300 MHz to 300 GHz, inclusive in some cases.

The region 230*ba* and the region 230*bb* functioning as the source region and the drain region are each a low-resistance region with an increased carrier concentration because they include a large amount of oxygen vacancies or have a high concentration of an impurity such as hydrogen, nitrogen, and a metal element. In other words, the region 230*ba* and the region 230*bb* are each an n-type region having a higher carrier concentration and a lower resistance than those of the region 230*bc*.

The carrier concentration in the region 230*bc* functioning as the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. Note that the lower limit of the carrier concentration in the region 230*bc* functioning as the channel formation region is not particularly limited and can be, for example, $1\times10^{-9}$ $cm^{-3}$.

Between the region 230*bc* and the region 230*ba* or the region 230*bb*, a region having a carrier concentration that is lower than or substantially equal to the carrier concentrations in the region 230*ba* and the region 230*bb* and higher than or substantially equal to the carrier concentration in the region 230*bc* may be formed. That is, the region functions as a junction region between the region 230*bc* and the region 230*ba* or the region 230*bb*. The hydrogen concentration in the junction region is lower than or substantially equal to the hydrogen concentrations in the region 230*ba* and the region 230*bb* and higher than or substantially equal to the hydrogen concentration in the region 230*bc* in some cases. The amount of oxygen vacancies in the junction region is smaller than or substantially equal to the amounts of oxygen vacancies in the region 230*ba* and the region 230*bb* and larger than or substantially equal to the amount of oxygen vacancies in the region 230*bc* in some cases.

Although FIG. 5A illustrates an example in which the region 230*ba*, the region 230*bb*, and the region 230*bc* are formed in the oxide 230*b*, the present invention is not limited thereto. For example, the above regions may be formed not only in the oxide 230*b* but also in the oxide 230*a*.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has lower concentrations of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide 230*a* and the oxide 230*b*) including the channel formation region.

The metal oxide functioning as a semiconductor preferably has a band gap of 2 eV or more, further preferably 2.5 eV or more. With use of a metal oxide having such a large bandgap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The atomic ratio of In to the element M in the metal oxide used as the oxide 230*b* is preferably greater than the atomic ratio of In to the element M in the metal oxide used as the oxide 230*a*.

The oxide 230*a* is placed under the oxide 230*b*, whereby impurities and an excess amount of oxygen can be inhibited from diffusing into the oxide 230*b* from components formed below the oxide 230*a*.

When the oxide 230*a* and the oxide 230*b* contain a common element (as the main component) besides oxygen, the density of defect states at an interface between the oxide 230*a* and the oxide 230*b* can be made low. Since the density of defect states at the interface between the oxide 230*a* and the oxide 230*b* can be made low, the influence of interface scattering on carrier conduction is small, and a high on-state current can be obtained.

The oxide 230*b* preferably has crystallinity. It is particularly preferable to use the above-described CAAC-OS as the oxide 230*b*.

The CAAC-OS is a metal oxide having a dense structure with high crystallinity and a small amount of impurities or defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary cannot be observed in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

Furthermore, a curved surface may be provided between a side surface of the oxide 230*b* and a top surface of the oxide 230*b* in a cross-sectional view of the transistor 200 in the channel width direction. In other words, an end portion of the side surface and an end portion of the top surface may be curved (hereinafter referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230*b* with the insulator 252, the insulator 250, the insulator 254, and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. Furthermore, the atomic ratio of In to the element M in the metal oxide used as the oxide 230*b* is preferably greater than the atomic ratio of In to the element M in the metal oxide used as the oxide 230*a*.

The oxide 230*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230*b* by the source electrode or the drain electrode. This can reduce oxygen extraction from the oxide 230*b* even when heat treatment is performed; thus, the transistor 200 is stable with respect to high temperatures in a manufacturing process (what is called thermal budget).

Here, the conduction band minimum gradually changes at a junction portion of the oxide 230*a* and the oxide 230*b*. In other words, the conduction band minimum at the junction portion of the oxide 230*a* and the oxide 230*b* continuously changes or is continuously connected. To achieve this, the density of defect states in a mixed layer formed at the interface between the oxide 230*a* and the oxide 230*b* is preferably made low.

Specifically, when the oxide 230*a* and the oxide 230*b* contain a common element as a main component besides oxygen, a mixed layer with a low density of defect states can be formed. For example, in the case where the oxide 230*b* is an In-M-Zn oxide, an In-M-Zn oxide, an M-Zn oxide, an oxide of the element M, an In—Zn oxide, indium oxide, or the like may be used as the oxide 230*a*.

Specifically, as the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230*b*, a metal oxide with In:M:Zn=1:1:1 [atomic ratio] or a composition in the neighborhood thereof, In:M:Zn=1:1:2 [atomic ratio] or a composition in the neighborhood thereof, or In:M:Zn=4:2:3 [atomic ratio] or a composition in the neighborhood thereof is used. Note that a composition in the neighborhood includes the range of ±30% of an intended atomic ratio. Gallium is preferably used as the element M.

Here, the oxide 230*a* and the oxide 230*b* are preferably formed using a sputtering method. Oxygen or a mixed gas of oxygen and a rare gas is used as the sputtering gas. Increasing the proportion of oxygen contained in the sputtering gas can increase the amount of oxygen in the deposited films. The deposition method of the oxide 230*a* and the oxide 230*b* is not limited to a sputtering method, and a CVD method, an MBE method, a PLD method, an ALD method, or the like can be used as appropriate.

When the metal oxide is deposited by a sputtering method, the above atomic ratio is not limited to the atomic ratio of the deposited metal oxide and may be the atomic ratio of a sputtering target used for depositing the metal oxide.

When the oxide 230*a* and the oxide 230*b* have the above structure, the density of defect states at the interface between the oxide 230*a* and the oxide 230*b* can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, the insulator 288, and the insulator 286 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, the insulator 283, the insulator 288, and the insulator 286, it is preferable to use an insulating material that has a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom (through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

An insulator having a function of inhibiting diffusion of oxygen and impurities such as water and hydrogen is preferably used as the insulator 212, the insulator 214, the insulator 271, the insulator 275, the insulator 282, the insulator 283, the insulator 288, and the insulator 286; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, the insulator 283, the insulator 288, and the insulator 286. For example, aluminum oxide or magnesium oxide, which has a function of capturing or fixing hydrogen, is preferably used for the insulator 214, the insulator 271, and the insulator 282. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 275, the insulator 282, the insulator 283, the insulator 288, and the insulator 286, which have a function of inhibiting diffusion of oxygen and impurities such as water and hydrogen.

As illustrated in FIG. 4B, the semiconductor device including the transistor 200 has a structure sandwiched between the insulator 286 and the insulator 212 each of which has a hydrogen barrier property, and thus hydrogen is less likely to diffuse into the transistor 200. The insulator 286 is provided to cover the insulator 285 and the conductor 246, whereby the amount of hydrogen diffusing into the transistor 200 through the conductor 246 can be reduced. On the inner side thereof, the transistor 200 is sealed with the insulator 212 and the insulator 283 and the insulator 288 each of which has a hydrogen barrier property. Thus, hydrogen diffusing into the transistor 200 can be further inhibited. On the further inner side, the insulator 214, the insulator 271, and the insulator 282, each of which has a high-performance function of capturing and fixing hydrogen, are provided, whereby low-concentration hydrogen in the vicinity of the transistor 200 is prevented from diffusing into the oxide 230.

In particular, an oxide having an amorphous structure is preferably used for the insulator 214, the insulator 271, the insulator 275, and the insulator 282. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be manufactured.

Although the insulator 214, the insulator 271, the insulator 275, and the insulator 282 preferably have an amorphous structure, they may partly include a region with a polycrystalline structure. The insulator 214, the insulator 271, the insulator 275, and the insulator 282 may have a multilayer structure in which a layer with an amorphous structure and a layer with a polycrystalline structure are stacked. For example, a stacked-layer structure in which a layer having a polycrystalline structure is formed over a layer having an amorphous structure may be employed.

The insulator 212*a*, the insulator 214, the insulator 271, the insulator 275, the insulator 282, the insulator 283, and the insulator 286*a* can be deposited by a sputtering method, for example. Since a sputtering method does not need to use a molecule containing hydrogen as a deposition gas, the hydrogen concentrations in the insulator 212*a*, the insulator 214, the insulator 271, the insulator 275, the insulator 282, the insulator 283, and the insulator 286*a* can be reduced. The insulator 212*b*, the insulator 288, and the insulator 286*b* are preferably deposited by an ALD method, particularly a PEALD method. By the method, the insulator 212*b*, the insulator 288, and the insulator 286*b* can be formed to have a good coverage; accordingly, the hydrogen barrier property of the insulator 212, the insulator 286, the insulator 283, and the insulator 288 can be improved.

Note that the film deposition method is not limited to a sputtering method and an ALD method, and a CVD method, an MBE method, a PLD method, or the like can be used as appropriate.

The resistivities of the insulator 212, the insulator 275, the insulator 283, and the insulator 286 are preferably low in some cases. For example, by setting the resistivities of the insulator 212, the insulator 275, the insulator 283, and the insulator 286 to approximately $1\times10^{13}$ Ωcm, the insulator 212, the insulator 275, the insulator 283, and the insulator 286 can sometimes reduce charge up of the conductor 205, the conductor 242, the conductor 260, or the conductor 246 in treatment using plasma or the like in the manufacturing process of a semiconductor device. The resistivities of the insulator 212, the insulator 275, the insulator 283, and the insulator 286 are preferably higher than or equal to $1\times10^{10}$ Ωcm and lower than or equal to $1\times10^{15}$ Ωcm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205*a* and the conductor 205*b*. The conductor 205*a* is provided in contact with a bottom surface and a sidewall of the opening. The conductor 205*b* is provided to be embedded in a recessed portion formed in the conductor 205*a*. Here, the top surface of the conductor 205*b* is substantially level with the top surfaces of the conductor 205*a* and the insulator 216.

Here, for the conductor 205*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material that has a function of inhibiting diffusion of oxygen (e.g., at least one of an oxygen atom, an oxygen molecule, and the like).

When the conductor 205*a* is formed using a conductive material having a function of inhibiting diffusion of hydrogen, impurities such as hydrogen contained in the conductor 205*b* can be prevented from diffusing into the oxide 230 through the insulator 224 and the like. When the conductor 205*a* is formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 205*a*. For example, titanium nitride is used for the conductor 205*a*.

Moreover, the conductor 205*b* is preferably formed using a conductive material containing tungsten, copper, or aluminum as its main component. For example, tungsten is used for the conductor 205*b*.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, reducing the amount of the impurities to be diffused into the oxide 230.

As illustrated in FIG. 4A, the conductor 205 is preferably provided so as to be larger than a region of the oxide 230 that does not overlap with the conductor 242*a* or the conductor 242*b*. It is particularly preferred that the conductor 205 extend also to a region beyond end portions of the oxide 230*a* and the oxide 230*b* in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of the first gate and the second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205*a* and the conductor 205*b* is illustrated, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 or the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, or zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Silicon oxide or silicon oxynitride, for example, can be used as appropriate for the insulator 224 that is in contact with the oxide 230.

In a manufacturing process of the transistor 200, heat treatment is preferably performed with a surface of the oxide 230 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, heat treatment may be performed in an atmosphere containing an oxidizing gas at 10 ppm or more, 1% or more, or 10% or more in order to compensate for released oxygen after heat treatment in a nitrogen gas or inert gas atmosphere. Alternatively, heat treatment may be performed in a nitrogen gas or inert gas atmosphere successively after heat treatment in an atmosphere containing an oxidizing gas at 10 ppm or more, 1% or more, or 10% or more.

Note that oxygen adding treatment performed on the oxide 230 can promote a reaction in which oxygen vacancies in the oxide 230 are repaired with supplied oxygen, i.e., a reaction of "$V_O$+O→null". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_OH$.

Such heat treatment can make the oxide 230 having a dense structure with higher crystallinity. The density of the oxide 230 is improved in this manner, which further reduces the diffusion of impurities or oxygen in the oxide 230.

Note that the insulator 222 and the insulator 224 may each have a stacked-layer structure of two or more layers. In such cases, without limitation to a stacked-layer structure formed of the same material, a stacked-layer structure formed of different materials may be employed. The insulator 224 may be formed into an island shape so as to overlap with the oxide 230*a*. In this case, the insulator 275 is in contact with a side surface of the insulator 224 and a top surface of the insulator 222.

The conductor 242*a* and the conductor 242*b* are provided in contact with a top surface of the oxide 230*b*. Each of the conductor 242*a* and the conductor 242*b* functions as a source electrode or a drain electrode of the transistor 200.

For the conductor 242 (the conductor 242*a* and the conductor 242*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230*b* or the like diffuses into the conductor 242*a* or the conductor 242*b* in some cases. In particular, when a nitride containing tantalum is used for the conductor 242*a* and the conductor 242*b*, hydrogen contained in the oxide 230*b* or the like is likely to diffuse into the conductor 242*a* or the conductor 242*b*, and the diffused hydrogen is bonded to nitrogen contained in the conductor 242*a* or the conductor 242*b* in some cases. That is, hydrogen contained in the oxide 230*b* or the like is absorbed by the conductor 242*a* or the conductor 242*b* in some cases.

No curved surface is preferably formed between a side surface of the conductor 242 and a top surface of the conductor 242. When no curved surface is formed in the conductor 242, the conductor 242 can have a large cross-sectional area in the channel width direction. Accordingly, the conductivity of the conductor 242 is increased, so that the on-state current of the transistor 200 can be increased.

The insulator 271*a* is provided in contact with the top surface of the conductor 242*a*, and the insulator 271*b* is provided in contact with the top surface of the conductor 242*b*. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. For example, a nitride containing silicon such as silicon nitride may be used for the insulator 271. The insulator 271 preferably has a function of capturing impurities such as hydrogen. In that case, for the insulator 271, a metal oxide having an amorphous structure, for example, an insulator such as aluminum oxide or magnesium oxide, may be used. It is particularly preferable to use aluminum oxide having an amorphous structure or amorphous aluminum oxide for the insulator 271 because hydrogen can be captured or fixed more effectively in some cases. Accordingly, the transistor 200 and a semiconductor device which have favorable characteristics and high reliability can be manufactured.

The insulator 275 is provided to cover the insulator 224, the oxide 230*a*, the oxide 230*b*, the conductor 242, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275. For example, aluminum oxide film may be deposited by a sputtering method, and silicon nitride may be deposited by a PEALD method.

When the above insulator 271 and the insulator 275 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium may be used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

The insulator 252 is preferably provided in contact with the top surface and side surface of the oxide 230*b*, the side surface of the oxide 230*a*, the side surface of the insulator 224, and the top surface of the insulator 222, also in the channel width direction. That is, the regions of the oxide 230*a*, the oxide 230*b*, and the insulator 224 that overlap with the conductor 260 are covered with the insulator 252 in the cross section in the channel width direction. With this structure, the insulator 252 having a barrier property against oxygen can prevent release of oxygen from the oxide 230*a* and the oxide 230*b* at the time of heat treatment or the like. This can inhibit formation of oxygen vacancies ($V_O$) in the oxide 230*a* and the oxide 230*b*. Therefore, oxygen vacancies ($V_O$) and $V_OH$ formed in the region 230*bc* can be reduced. Thus, the transistor 200 can have favorable electrical characteristics and higher reliability.

Even when an excess amount of oxygen is contained in the insulator 280, the insulator 250 and the like, oxygen can be inhibited from being excessively supplied to the oxide 230*a* and the oxide 230*b*. Thus, the region 230*ba* and the region 230*bb* are prevented from being excessively oxidized by oxygen through the region 230*bc*; a reduction in on-state current or field-effect mobility of the transistor 200 can be inhibited.

As illustrated in FIG. 4B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280, and the like, together with the insulator 254, the insulator 250, and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 252 preferably includes a region having the above-described thickness. The thickness of the insulator 252 is preferably smaller than that of the insulator 250. In that case, at least part of the insulator 252 preferably includes a region having a thickness smaller than that of the insulator 250.

To form the insulator 252 having a small thickness like the above-described thickness, an ALD method is preferably used for deposition. The ALD method includes a thermal ALD method, in which a precursor and a reactant react with each other only by a thermal energy, a PEALD method, in which a reactant excited by plasma is used, for example. The use of plasma in a PEALD method is sometimes preferable because deposition at a lower temperature is possible.

The insulator 250 functions as part of the gate insulator. The insulator 250 is preferably in contact with a top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride are preferable because they are thermally stable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with a thickness like the above-described thickness.

Although FIG. 4A, FIG. 4B, or the like illustrates a single-layer structure of the insulator 250, the present invention is not limited to this structure, and a stacked-layer structure of two or more layers may be employed. For example, as illustrated in FIG. 5B, the insulator 250 may have a stacked-layer structure including two layers of an insulator 250*a* and an insulator 250*b* over the insulator 250*a*.

Figure 5B:
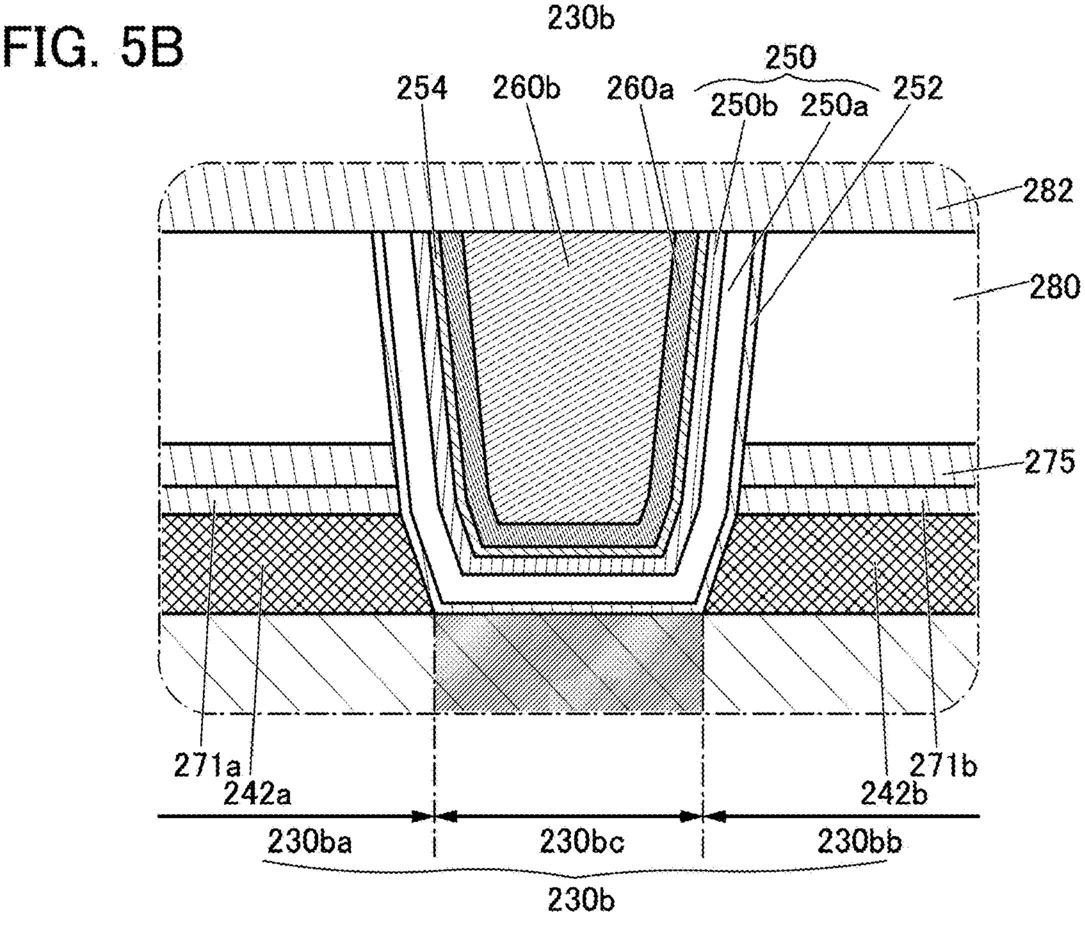

In the case where the insulator 250 has a stacked-layer structure of two layers as illustrated in FIG. 5B, it is preferable that the insulator 250*a* in a lower layer be formed using an insulator that is likely to transmit oxygen and the insulator 250*b* in an upper layer be formed using an insulator having a function of inhibiting oxygen diffusion. With such a structure, oxygen contained in the insulator 250*a* can be inhibited from diffusing into the conductor 260. That is, a reduction in the amount of oxygen supplied to the oxide 230 can be inhibited. In addition, oxidation of the conductor 260 due to oxygen contained in the insulator 250*a* can be inhibited. For example, it is preferable that the insulator 250*a* be provided using any of the above-described materials that can be used for the insulator 250 and the insulator 250*b* be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250*b*. In this case, the insulator 250*b* is an insulator containing at least oxygen and hafnium. The thickness of the insulator 250*b* is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator **250*b*** may include a region having a thickness like the above-described thickness.

In the case where silicon oxide, silicon oxynitride, or the like is used for the insulator **250*a*, the insulator 250*b* may be formed using an insulating material that is a high-k material having a high dielectric constant. The gate insulator having a stacked-layer structure of the insulator 250*a* and the insulator 250*b* can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250** can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide **230*b*. As the insulator 254, an insulator that can be used as the insulator 283 described above may be used. For example, silicon nitride deposited by a PEALD method may be used as the insulator 254. In this case, the insulator 254** is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 254 preferably includes a region having the above-described thickness. The thickness of the insulator 254 is preferably smaller than that of the insulator 250. In that case, at least part of the insulator 254 may include a region having a thickness that is smaller than that of the insulator 250.

The conductor 260 functions as the first gate electrode of the transistor 200. The conductor 260 preferably includes the conductor **260*a* and the conductor 260*b* placed over the conductor 260*a*. For example, the conductor 260*a* is preferably placed to cover a bottom surface and a side surface of the conductor 260*b*. Moreover, as illustrated in FIG. 4B, the top surface of the conductor 260 is substantially level with the uppermost portion of the insulator 250. Note that although the conductor 260 has a two-layer structure of the conductor 260*a* and the conductor 260*b* in FIG. 4B, the conductor 260** can have a single-layer structure or a stacked-layer structure of three or more layers.

For the conductor **260*a***, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material that has a function of inhibiting diffusion of oxygen (e.g., at least one of an oxygen atom, an oxygen molecule, and the like).

In addition, when the conductor **260*a* has a function of inhibiting diffusion of oxygen, the conductivity of the conductor 260*b* can be inhibited from being lowered because of oxidation due to oxygen contained in the insulator 250**. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor **260*b*. The conductor 260*b*** may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor **242*a* and the conductor 242*b*** without alignment.

In the channel width direction of the transistor 200, assuming a bottom surface of the insulator 222 is as a benchmark, the level of the bottom surface of the conductor 260 in a region where the conductor 260 and the oxide **230*b* do not overlap is preferably lower than the level of a bottom surface of the oxide 230*b*. When the conductor 260 functioning as the gate electrode covers the side surface and top surface of the channel formation region of the oxide 230*b* with the insulator 250 and the like therebetween, the electric field of the conductor 260 can easily act on the entire channel formation region of the oxide 230*b*. Thus, the on-state current of the transistor 200 can be increased and the frequency characteristics of the transistor 200 can be improved. With the bottom surface of the insulator 222 as a benchmark, the difference between the level of the bottom surface of the conductor 260 in a region where the conductor 260 does not overlap with the oxide 230*a* or the oxide 230*b* and the level of the bottom surface of the oxide 230*b*** is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The insulator 280 preferably includes an excess-oxygen region or excess oxygen. The concentration of impurities such as water and hydrogen in the insulator 280 is preferably reduced. Silicon oxide, silicon oxynitride, or the like may be used as appropriate for the insulator 280, for example. When the insulator 280 is formed by a sputtering method in an oxygen-containing atmosphere, the insulator 280 containing excess oxygen can be formed. When the insulator 280 containing excess oxygen is provided, oxygen vacancies in the oxide 230 can be reduced and the reliability of the transistor 200 can be improved. By a sputtering method that does not need to use hydrogen as a deposition gas, the concentration of hydrogen in the insulator 280 can be reduced. The insulator 282 in contact with the top surface of the insulator 280 may be formed by a sputtering method in an atmosphere containing oxygen so that oxygen can be supplied to the insulator 280. When oxygen is supplied to the insulator 280 by forming the insulator 282, the formation method of the insulator 280 is not limited to a sputtering method, and a CVD method, an MBE method, a PLD method, an ALD method, or the like may be employed. For example, the insulator 280 may have a stacked-layer structure of silicon oxide deposited by a sputtering method and silicon oxynitride deposited thereover by a CVD method. Furthermore, silicon nitride may be stacked thereover.

The insulator 282 preferably functions as barrier insulating films that inhibit impurities such as water and hydrogen from diffusing into the insulator 280 from above and preferably has a function of capturing impurities such as hydrogen. The insulator 282 preferably functions as a barrier insulating film that inhibits passage of oxygen. For each of the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, for hydrogen can be captured or fixed more effectively in some cases. Accordingly, the transistor 200 and a semiconductor device which have favorable characteristics and high reliability can be manufactured.

The insulator 282 is preferably formed by a sputtering method. When the insulator 282 is formed by a sputtering method, oxygen can be added to the insulator 280. The formation method of the insulator 282 is not limited to a sputtering method; a CVD method, an MBE method, a PLD method, an ALD method, or the like may be used as appropriate.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, a high-density silicon nitride film can be formed. By a sputtering method that does not need to use a molecule containing hydrogen as a deposition gas, the concentration of hydrogen in the insulator 283 can be reduced.

The insulator 288 is preferably formed using a nitride containing silicon such as silicon nitride. For example, silicon nitride deposited by a PEALD method may be used as the insulator 288. When the coverage with the insulator 288 is made better, the hydrogen barrier property of the stacked structure of the insulator 283 and the insulator 288 can be improved. For this structure, the CMP treatment is performed on the insulator 283, the insulator 288, and the insulator 274 until the uppermost portion of the insulator 283 is exposed. Thus, the uppermost portions of the insulator 283, the insulator 288, and the insulator 274 are substantially aligned with each other.

For the conductor 240*a* and the conductor 240*b*, a conductive material containing tungsten, copper, or aluminum as its main component is preferably used. The conductor 240*a* and the conductor 240*b* may each have a stacked-layer structure.

In the case where the conductor 240 has a stacked-layer structure, a conductive material having a function of inhibiting passage of impurities such as water and hydrogen is preferably used for a first conductor placed in the vicinity of the insulator 285, the insulator 283, the insulator 282, the insulator 280, the insulator 275, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240*a* and the conductor 240*b*.

For the insulator 241*a* and the insulator 241*b*, for example, a barrier insulating film that can be used for the insulator 275 or the like may be used. For the insulator 241*a* and the insulator 241*b*, for example, an insulator such as silicon nitride, aluminum oxide, or silicon nitride oxide may be used. Since the insulator 241*a* and the insulator 241*b* are provided in contact with the insulator 283, the insulator 282, and the insulator 271, impurities such as water and hydrogen contained in the insulator 280 or the like can be inhibited from entering the oxide 230 through the conductor 240*a* and the conductor 240*b*. In particular, silicon nitride is suitable because of its high blocking property against hydrogen. Furthermore, oxygen contained in the insulator 280 can be prevented from being absorbed by the conductor 240*a* and the conductor 240*b*.

When the insulator 241*a* and the insulator 241*b* each have a stacked-layer structure illustrated in FIG. 4B, a first insulator in contact with an inner wall of the opening formed in the insulator 280 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be prevented from entering the conductor 240.

The conductor 246 (the conductor 246*a* and the conductor 246*b*) functioning as a wiring may be placed in contact with a top surface of the conductor 240*a* and a top surface of the conductor 240*b*. The conductor 246 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

Although the transistor 200 including the conductor 260 that functions as a first gate electrode and the conductor 205 that functions as a second gate electrode as illustrated in FIG. 4A is described in this embodiment, the present invention is not limited thereto. Any structure may be used for a transistor as long as the transistor includes an oxide semiconductor film, and the transistor may be designed as appropriate in consideration of characteristics required for a semiconductor device. For example, the transistor may have a top-gate structure or a bottom-gate structure.

<Component Material for Semiconductor Device>

Component materials that can be used for the semiconductor device are described below.

<<Substrate>>

As a substrate where the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is preferable to use, in particular, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also referred to as a metal oxide in some cases. A metal oxide containing nitrogen may be referred to as a metal oxynitride.

<Classification of Crystal Structure>

First, the classification of the crystal structures of an oxide semiconductor is explained with reference to FIG. 6A. FIG. 6A is a diagram showing the classification of crystal structures of an oxide semiconductor, typically IGZO (a metal oxide containing In, Ga, and Zn).

As shown in FIG. 6A, an oxide semiconductor is roughly classified into "Amorphous", "Crystalline", and "Crystal". The term "Amorphous" includes completely amorphous. "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). The term "Crystal" includes single crystal and poly crystal.

Note that the structures in the thick frame in FIG. 6A are in an intermediate state between "Amorphous" and "Crystal," and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 6B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 6B and obtained by GIXD measurement is hereinafter simply referred to as an XRD spectrum. The CAAC-IGZO film in FIG. 6B has a composition in the vicinity of In:Ga:Zn=4:2:3 [atomic ratio]. The CAAC-IGZO film in FIG. 6B has a thickness of 500 nm.

In FIG. 6B, the horizontal axis represents 2θ [deg.], and the vertical axis represents intensity [a.u.]. As shown in FIG. 6B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 6B, the peak at 2θ of around 31° is asymmetric with respect to the axis of the angle at which the peak intensity is detected.

A crystal structure of a film or a substrate can also be evaluated with a diffraction pattern observed by a nanobeam electron diffraction (NBED) method (such a pattern is also referred to as a nanobeam electron diffraction pattern). FIG. 6C shows a diffraction pattern of the CAAC-IGZO film. FIG. 6C shows a diffraction pattern obtained by the NBED method in which an electron beam is incident in the direction parallel to the substrate. The CAAC-IGZO film in FIG. 6C has a composition in the neighborhood of In:Ga:Zn=4:2:3 [atomic ratio]. In addition, in the nanobeam electron diffraction method, electron diffraction is performed with a probe diameter of 1 nm.

As shown in FIG. 6C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 6A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter an In layer) and a layer containing the element M, zinc (Zn), and oxygen (hereinafter an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear crystal grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is less likely to occur. Moreover, since the crystallinity of an oxide semiconductor might be decreased by entry of impurities, formation of defects, and the like, the CAAC-OS can be regarded as an oxide semiconductor that has small amounts of impurities, defects, and the like (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1\times10^{17}$ $cm^{-3}$, preferably lower than or equal to $1\times10^{15}$ $cm^{3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{3}$, and higher than or equal to $1\times10^{-9}$ $cm^{3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor in the channel formation region and the concentration of silicon or carbon in the vicinity of an interface with the oxide semiconductor in the channel formation region (the concentrations obtained by secondary ion mass spectrometry (SIMS)) are each set lower than or equal to $2\times10^{18}$ atoms/$cm^{3}$, preferably lower than or equal to $2\times10^{17}$ atoms/$cm^{3}$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the channel formation region in the oxide semiconductor, which is obtained by SIMS, is lower than or equal to $1\times10^{18}$ atoms/$cm^{3}$, preferably lower than or equal to $2\times10^{16}$ atoms/$cm^{3}$.

When the oxide semiconductor contains nitrogen, the oxide semiconductor easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than $5\times10^{19}$ atoms/$cm^{3}$, preferably lower than or equal to $5\times10^{18}$ atoms/

$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region in the oxide semiconductor is preferably reduced as much as possible. Specifically, the hydrogen concentration in the channel formation region in the oxide semiconductor, which is obtained by SIMS, is set lower than $1\times10^{20}$ atoms/$cm^3$, preferably lower than $5\times10^{19}$ atoms/$cm^3$, further preferably lower than $1\times10^{19}$ atoms/$cm^3$, still further preferably lower than $5\times10^{18}$ atoms/$cm^3$, yet still further preferably lower than $1\times10^{18}$ atoms/$cm^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Application Example of Semiconductor Device>

An example of the semiconductor device of one embodiment of the present invention will be described below with reference to FIG. 7.

Figure 7A:
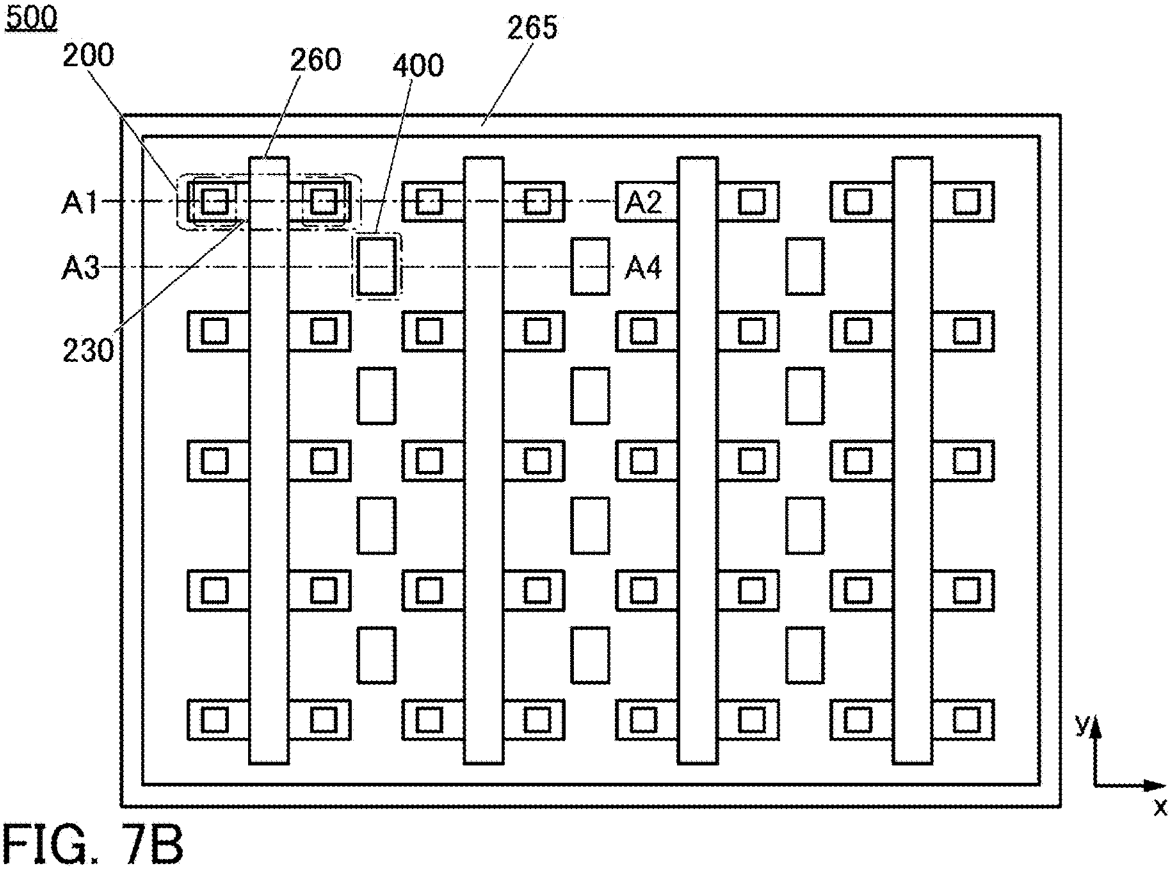
FIG. 7A is a plan view of a semiconductor device of one embodiment of the present invention.
Figure 7B:
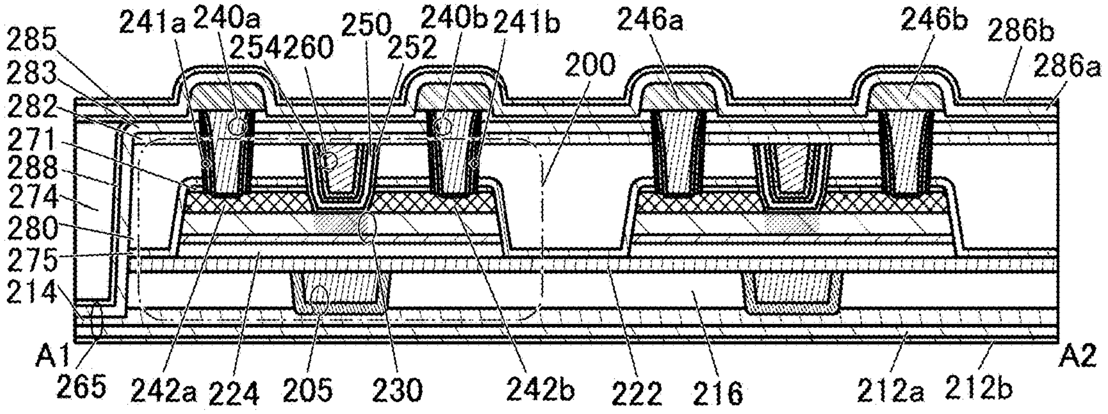
FIG. 7B and FIG. 7C are cross-sectional views of the semiconductor device of one embodiment of the present invention.
Figure 7C:
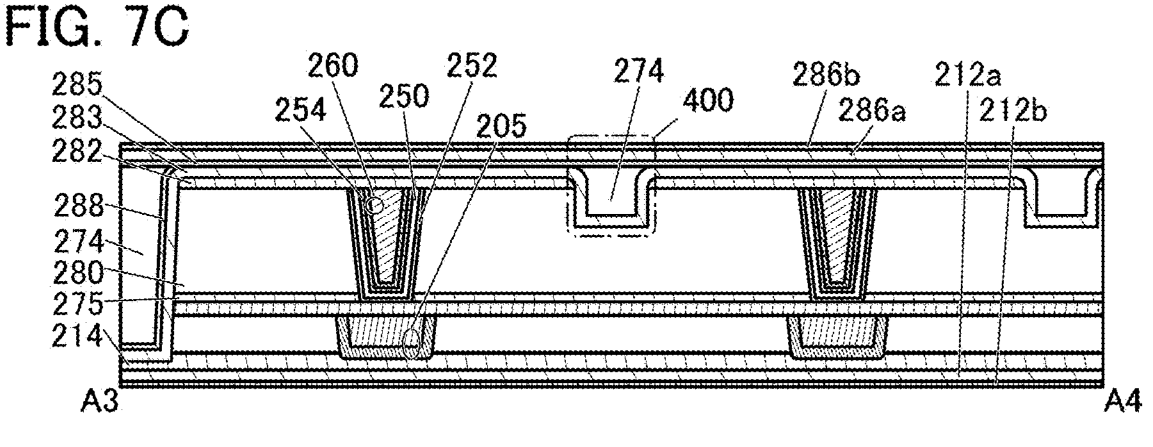

FIG. 7A is a top view of a semiconductor device 500. In FIG. 7A, the x-axis is parallel to the channel length direction of the transistor 200, and the y-axis is perpendicular to the x-axis. FIG. 7B is a cross-sectional view corresponding to a portion indicated by the dashed-dotted line A1-A2 in FIG. 7A, and is also a cross-sectional view of the transistor 200 in the channel length direction. FIG. 7C is a cross-sectional view corresponding to a portion indicated by the dashed-dotted line A3-A4 in FIG. 7A, and is also a cross-sectional view of an opening region 400 and its vicinity. Note that for clarity of the drawing, some components are not illustrated in the top view of FIG. 7A.

Note that in the semiconductor device illustrated in FIG. 7A to FIG. 7C, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

The semiconductor device 500 illustrated in FIG. 7A to FIG. 7C is a modification example of the semiconductor device illustrated in FIG. 4A and FIG. 4B. The semiconductor device 500 illustrated in FIG. 7A to FIG. 7C is different from the semiconductor device illustrated in FIG. 4A and FIG. 4B in that the opening region 400 is formed in the insulator 282 and the insulator 280. Moreover, a sealing portion 265 is formed to surround a plurality of transistors 200, which is a different point from the semiconductor device illustrated in FIG. 4A and FIG. 4B.

The semiconductor device 500 includes a plurality of transistors 200 and a plurality of opening regions 400 arranged in a matrix. In addition, a plurality of conductors 260 functioning as gate electrodes of the transistors 200 are provided to extend in the y-axis direction. The opening regions 400 are provided in regions not overlapping with the oxide 230 or the conductor 260. The sealing portion 265 is formed so as to surround the plurality of transistors 200, the plurality of conductors 260, and the plurality of opening regions 400. Note that the number, the position, and the size of the transistors 200, the conductors 260, and the opening regions 400 are not limited to those illustrated in FIG. 7 and may be set as appropriate in accordance with the design of the semiconductor device 500.

As illustrated in FIG. 7B and FIG. 7C, the sealing portion 265 is provided to surround the plurality of transistors 200, the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with a top surface of the insulator 214. In the sealing portion 265, the insulator 288 and the insulator 274 are provided between the insulator 283 and the insulator 285. The uppermost portions of the insulator 288 and the insulator 274 are substantially level with the uppermost portion of the insulator 283. As the insulator 274, an insulator similar to the insulator 280 can be used.

Such a structure enables the plurality of transistors 200 to be surrounded by the insulator 283, the insulator 214, and the insulator 212. One or more of the insulator 283, the insulator 214, and the insulator 212 preferably function as a barrier insulating film against hydrogen. Accordingly, entry of hydrogen contained in the region outside the sealing portion 265 into a region in the sealing portion 265 can be inhibited.

The sealing portion may have such a structure that an opening is formed in the insulator 283, the insulator 288, the insulator 274, and the insulator 285 outside of the sealing portion 265 so that the insulator 286 and the insulator 214 are in contact with each other. Alternatively, the sealing portion may have a structure such that an opening is formed in the insulator 214, the insulator 283, the insulator 288, the insulator 274, and the insulator 285 outside the sealing portion 265 so that the insulator 286*a* and the insulator 212*a* are in contact with each other. In other words, the structure illustrated in FIG. 1C may be employed.

As illustrated in FIG. 7C, the insulator 282 has an opening portion in the opening region 400. In the opening region 400, the insulator 280 may have a groove to overlap with the opening portion in the insulator 282. The depth of the groove portion of the insulator 280 is less than or equal to the depth at which a top surface of the insulator 275 is exposed and is, for example, approximately greater than or equal to ¼ and less than or equal to ½ of the maximum thickness of the insulator 280.

As illustrated in FIG. 7C, the insulator 283 is in contact with a side surface of the insulator 282, the side surface of the insulator 280, and the top surface of the insulator 280 inside the opening region 400. Part of the insulator 274 is formed in the opening region 400 to fill the depression portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be prevented from entering the oxide 230.

In FIG. 7A, the shape of the opening region 400 in the top view is substantially rectangular; however, the present invention is not limited to the shape. For example, the shape of the opening region 400 in the top view can be a rectangular shape, an elliptical shape, a circular shape, a rhombus shape, or a shape obtained by combining any of the above shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

According to one embodiment of the present invention, a novel semiconductor device can be provided. According to another embodiment of the present invention, a novel manufacturing method of a semiconductor device can be provided. According to another embodiment of the present invention, a semiconductor device with a small variation in transistor characteristics can be provided. According to another embodiment of the present invention, a semiconductor device having favorable electrical characteristics can be provided. According to another embodiment of the present invention, a semiconductor device with favorable reliability can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with favorable frequency characteristics can be provided. According to another embodiment of the present invention, a semiconductor device that can be miniaturized or highly integrated can be provided. According to another embodiment of the present invention, a semiconductor device with low power consumption can be provided.

At least part of the structure, method, and the like described in this embodiment can be implemented in appropriate combination with any of those in the other embodiments and the other example described in this specification.

Embodiment 3

In this embodiment, one mode of a semiconductor device will be described with reference to FIG. 8.

[Storage Device 1]

Figure 8:
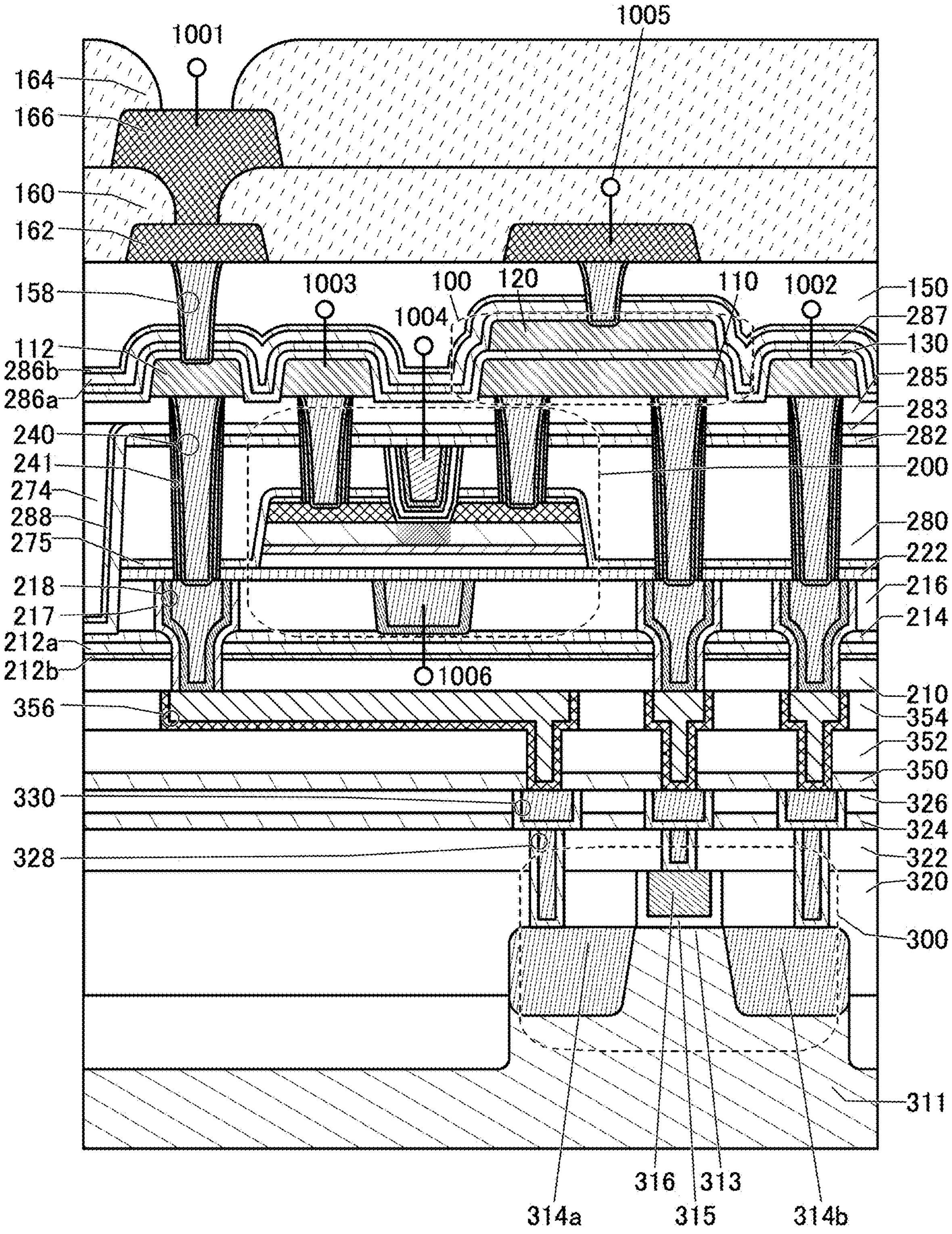
FIG. 8 is a cross-sectional view of a structure of a storage device of one embodiment of the present invention.

FIG. 8 illustrates an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. Since the transistor 200 has a low off-state current, a storage device that uses the transistor 200 can retain stored data for a long time. In other words, such a storage device does not require refresh operation or has extremely low frequency of the refresh operation, which leads to a sufficient reduction in power consumption of the storage device.

In the semiconductor device illustrated in FIG. 8, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage device illustrated in FIG. 8 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314*a* and a low-resistance region 314*b* functioning as a source region and a drain region. The transistor 300 may be a p-channel transistor or an n-channel transistor.

Here, in the transistor 300 illustrated in FIG. 8, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 8 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. An insulator 287 is preferably provided to cover the insulator 130.

For example, a conductor 112 and the conductor 110 over the conductor 240 can be formed at the same time. Note that the conductor 112 functions as a plug or a wiring that is electrically connected to the capacitor 100, the transistor 200, or the transistor 300. Like the conductor 130, the conductor 112 may be covered with the insulator 287. The conductor 112 corresponds to the conductor 246 in the above embodiment, and the description of the conductor 246 can be referred to for the details of the conductor 112.

Although the conductor 112 and the conductor 110 having a single-layer structure are illustrated in FIG. 8, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided as stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, for the insulator 130, a stacked-layer structure of a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, a material having ferroelectricity may be used for the insulator 130. Examples of a material used for the insulator 130 include a mixed crystal of hafnium oxide and zirconium oxide (also referred to as "HZO"), and a material in which an element X (the element X is silicon (Si), aluminum (Al), gadolinium (Gd), yttrium (Y), lanthanum (La), strontium (Sr), or the like) is added to hafnium oxide. Alternatively, a piezoelectric ceramic having a perovskite structure may be used for the insulator 130. For example, lead zirconate titanate (PZT), strontium bismuth tantalate (SBT), bismuth ferrite (BFO), or barium titanate may be used.

As the insulator 287, an insulator having a function of capturing and fixing hydrogen, which can be used as the insulator 214, the insulator 282, or the like, is preferably used. For example, aluminum oxide or the like is preferably used. Being provided over and in contact with the insulator 130, such an insulator 287 can capture and fix hydrogen contained in the insulator 130, so that the hydrogen concentration in the insulator 130 can be reduced. Thus, the leakage current between the conductor 110 and the conductor 120 can be reduced.

Note that although the capacitor 100 of the storage device illustrated in FIG. 8 has a planar shape, the storage device described in this embodiment is not limited thereto. For example, the capacitor 100 may be a cylindrical capacitor.

Examples of a material with high dielectric strength (a material having a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 8, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212 (the insulator 212*a* and the insulator 212*b*), the insulator 214, and the insulator 216. Note that the conductor 218 has a function of a plug or a wiring that is electrically connected to the capacitor 100 or the transistor 300.

Here, like the insulator 241 described in the above embodiment, an insulator 217 is provided in contact with a side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, entry of impurities such as water or hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

As in the above embodiment, the insulator 286 (the insulator 286*a* and the insulator 286*b*) functioning as a barrier insulating film is provided over the conductor 112 and the conductor 110 corresponding to the conductor 246. The insulator 286 is provided to cover the insulator 287. An insulator 150 is provided over the insulator 286. A conductor 158 is formed to be embedded in the insulator 150.

A conductor 162 is provided over the insulator 150, and an insulator 160 is provided to cover the conductor 162. A conductor 166 is provided over the insulator 160, and an insulator 164 is provided over the conductor 166. The insulator 160 and the insulator 164 can be formed using an organic resin such as polyimide. The conductor 162 and the conductor 166 can be formed using a low-resistance conductive film such as an aluminum film.

Here, part of the conductor 166 is electrically connected to the wiring 1001 and electrically connected to the transistor 300 through the conductor 162, the conductor 158, the conductor 112, and the like. Part of the conductor 162 is electrically connected to the wiring 1005 and electrically connected to the conductor 120 of the capacitor 100 through the conductor 158.

As described above, many interlayer insulating films, wirings, and the like, which contain impurities such as hydrogen affecting the oxide semiconductor film, are provided over the transistor 200. In particular, the insulator 160 and the insulator 164 formed using an organic resin are likely to diffuse hydrogen. However, the insulator 287 is covered with the insulator 286 that is an insulating film having a barrier property against hydrogen, which can reduce the amount of hydrogen diffusing into the transistor 200 and the like. Furthermore, when most of the conductor 120 is covered with the insulator 286, the amount of hydrogen diffusing into the transistor 200 through the conductor 112 functioning as a wiring can be significantly reduced.

Figure 9:
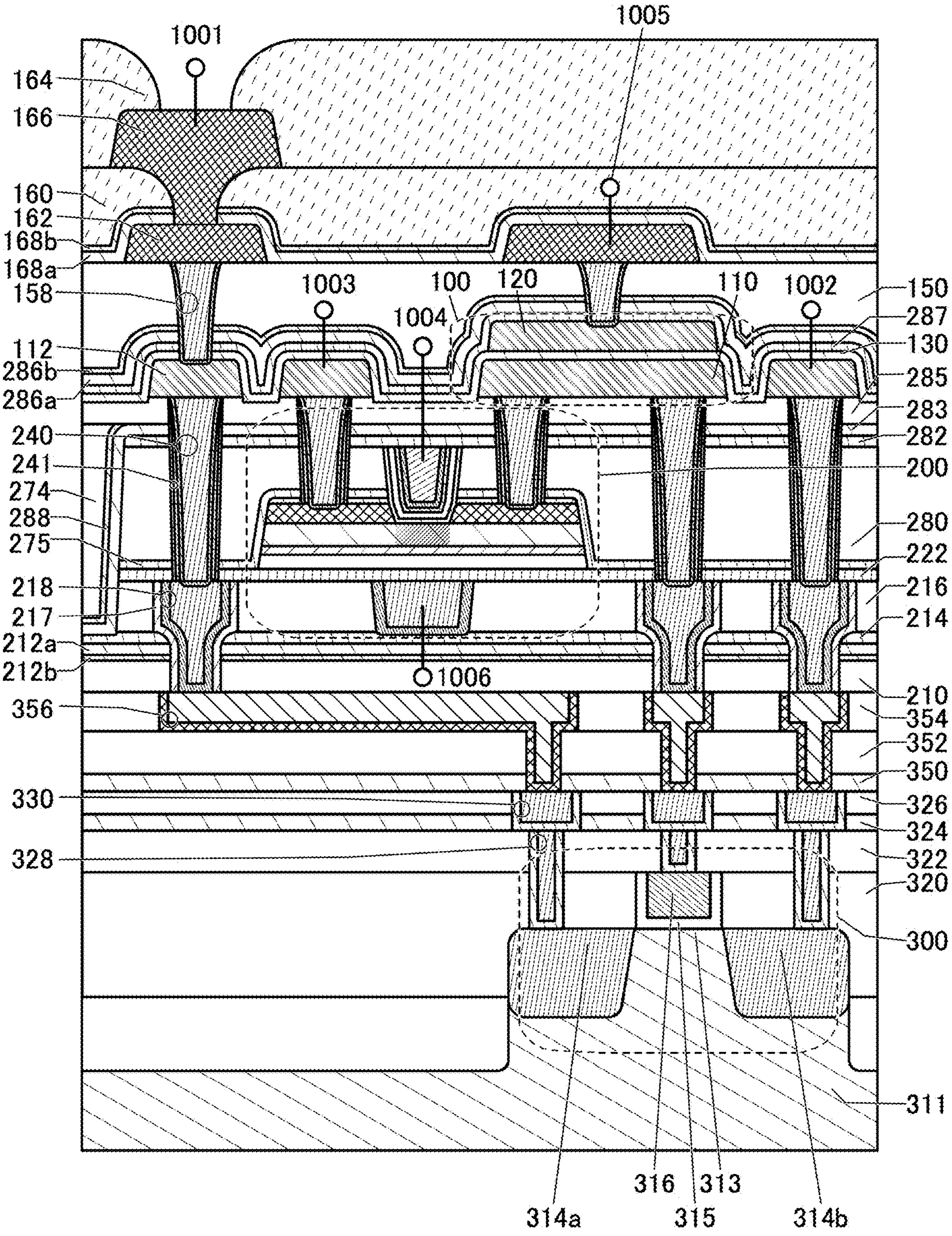
FIG. 9 is a cross-sectional view of a structure of a storage device of one embodiment of the present invention.

As illustrated in FIG. 9, an insulator 168*a* and an insulator 168*b* each of which functions as a barrier insulating film against hydrogen may be provided to cover the insulator 150 and the conductor 162. The insulator 168*a* has a structure similar to that of the insulator 286*a*, and accordingly the description of the insulator 286*a* can be referred to for the details. The insulator 168*b* over the insulator 168*a* has a structure similar to that of the insulator 286*b*, and accordingly the description of the insulator 286*b* can be referred to for the details. Hereinafter, the insulator 168*a* and the insulator 168*b* are collectively referred to as an insulator 168, in some cases.

In this manner, the insulator 168 is provided in contact with the bottom surface of the insulator 160 formed using an organic resin, whereby the amount of hydrogen diffusing below from the insulator 160 can be further reduced.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, as the insulator 150, the insulator 210, the insulator 352, the insulator 354, and the like, an insulator having a low dielectric constant is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic. Note that these resins may be used for the insulator 160 and the insulator 164.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 350, the insulator 212, the insulator 214, the insulator 282, the insulator 283, the insulator 286, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 110, the conductor 120, the conductor 158, and the like, a single layer or a stacked layer of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance. The conductor 162 and the conductor 166 are preferably formed using a low-resistance conductive material.

<Wiring or Plug in Layer Including Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 8, the insulator 241 is preferably provided between the conductor 240 and the insulator 224 and the insulator 280 that contain excess oxygen. Since the insulator 241 is provided in contact with the insulator 222, the insulator 282, and the insulator 283, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

The insulator 241 is preferably formed using an insulating material having a function of inhibiting diffusion of oxygen and impurities such as water or hydrogen. For example, silicon nitride, silicon nitride oxide, aluminum oxide, hafnium oxide, or the like is preferably used. In particular, silicon nitride is preferable because of its high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, the insulator 283, and the insulator 286. Such a structure can inhibit entry of hydrogen contained in the insulator 274, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 8, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of the memory cell including the plurality of transistors 200.

That is, in the opening provided in the insulator 282, the insulator 280, the insulator 275, the insulator 222, and the insulator 216, the insulator 214 is in contact with the insulator 283.

For example, an opening may be provided in the insulator 282, the insulator 280, the insulator 275, the insulator 222, the insulator 216, and the insulator 214. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen or water from the direction of the side surface of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Although an example in which the transistor 200 is sealed with the insulator 283 and the insulator 214 or the insulator 212 and a dicing line is formed in a region where the insulators are in contact with each other, the present invention is not limited thereto. For example, the transistor 200 may be sealed with the insulator 286 and the insulator 214 or the insulator 212, and a dicing line may be formed in a region where the insulators are in contact with each other.

Embodiment 4

In this embodiment, a storage device of one embodiment of the present invention including a transistor in which an oxide semiconductor is used as a semiconductor (hereinafter referred to as an OS transistor in some cases) and a capacitor (hereinafter referred to as an OS memory device in some cases), is described with reference to FIG. 10A, FIG. 10B, and FIG. 11A to FIG. 11H. The OS memory device is a storage device that includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Storage Device>

Figure 10A:
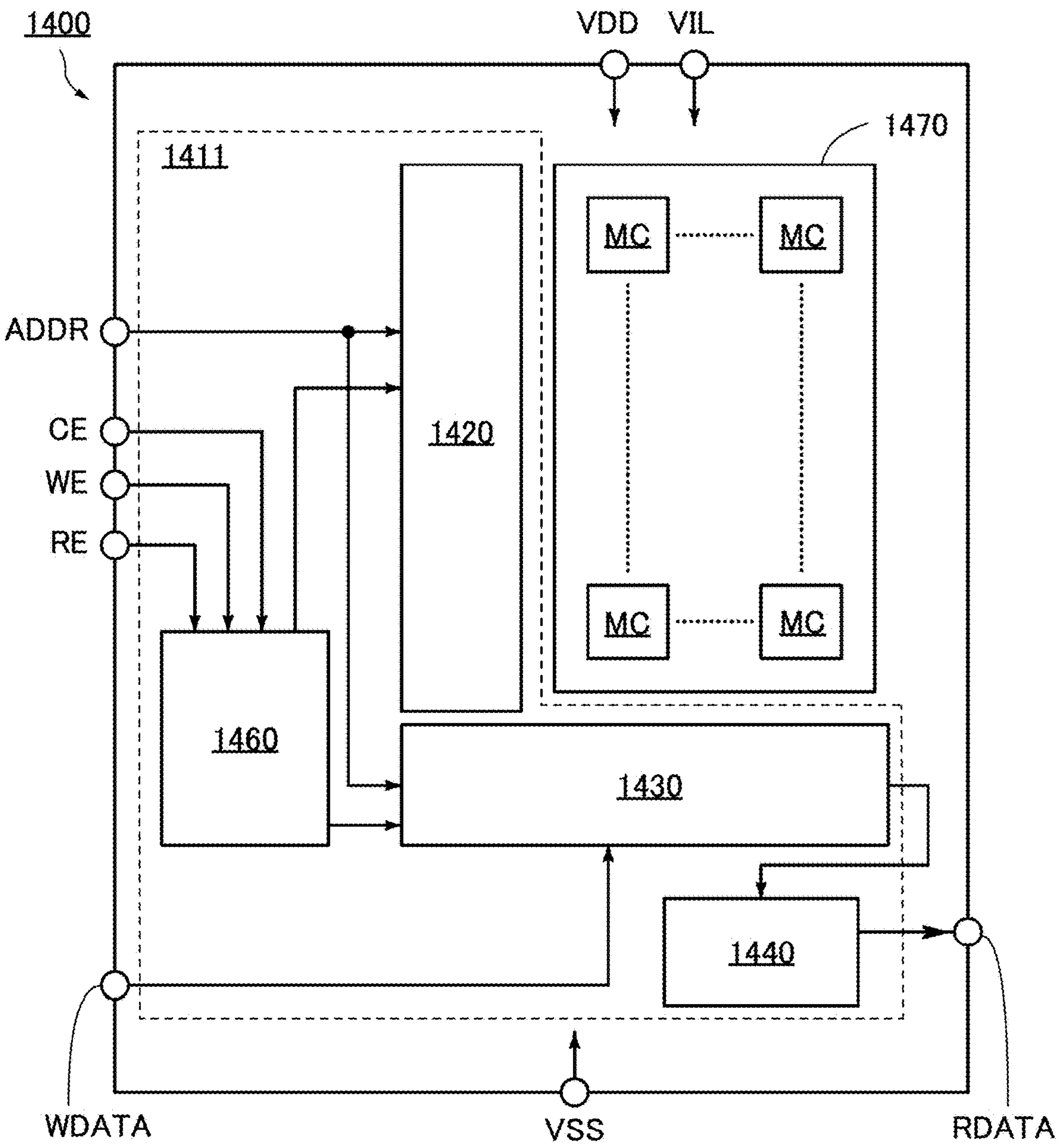
FIG. 10A is a block diagram of a structure example of a storage device of one embodiment of the present invention.

FIG. 10A illustrates a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Figure 10B:
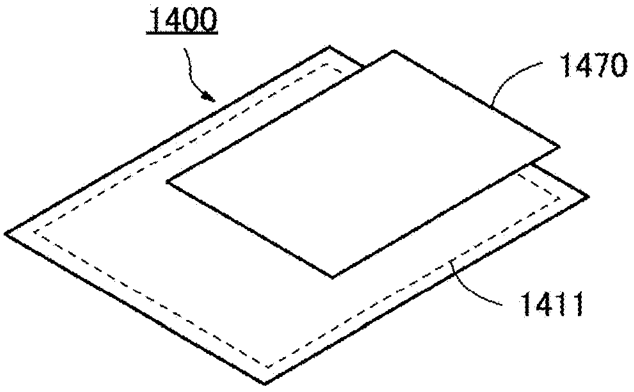
FIG. 10B is a perspective view of a structure example of the storage device of one embodiment of the present invention.

Note that FIG. 10A illustrates an example in which the peripheral circuit 1411 and the memory cell array 1470 are formed on the same plane; however, this embodiment is not limited thereto. For example, as illustrated in FIG. 10B, the memory cell array 1470 may be provided to overlap part of the peripheral circuit 1411. For example, the sense amplifier may be provided below the memory cell array 1470 so that they overlap with each other.

FIG. 11A to FIG. 11H show structure examples of a memory cell applicable to the memory cell MC.

[DOSRAM]

Figure 11A:
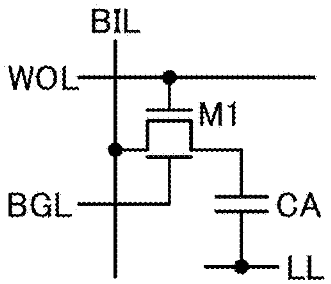
FIG. 11A to FIG. 11H are circuit diagrams each illustrating a structure example of a storage device of one embodiment of the present invention.
Figure 11B:
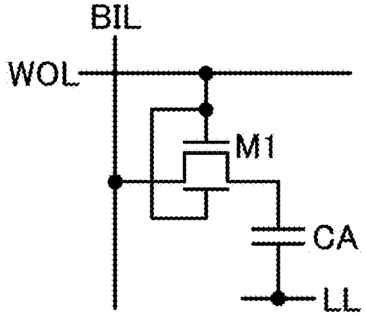
Figure 11C:
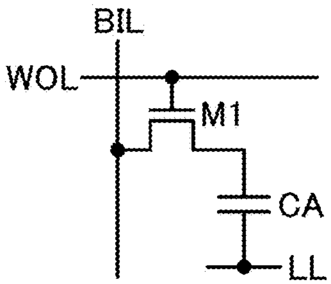

FIG. 11A to FIG. 11C illustrate circuit structure examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 11A includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. In the time of data writing and data reading, a low-level potential is preferably applied to the wiring LL. The wiring BGL functions as a wiring for applying a potential to the back gate of the transistor M1. When a given potential is applied to the wiring BGL, the threshold voltage of the transistor M1 can be increased or decreased.

The memory cell 1471 in FIG. 11A corresponds to the structure in which the conductor 110 is not electrically connected to the gate of the transistor 300 in the memory device in FIG. 8. That is, the transistor M1 and the capacitor CA correspond to the transistor 200 and the capacitor 100, respectively.

The circuit structure of the memory cell MC is not limited to that of the memory cell 1471, and the circuit structure can be changed. For example, in the memory cell MC, the back gate of the transistor M1 may be connected to the wiring WOL instead of the wiring BGL as in a memory cell 1472 illustrated in FIG. 11B. As another example, the memory cell MC may be configured with a single-gate transistor, that is, the transistor M1 that does not have a back gate, like a memory cell 1473 illustrated in FIG. 11C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with use of the transistor M1, written data can be retained for a long time, and thus the frequency of the refresh operation for the memory cell can be decreased. Alternatively, refresh operation for the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. This reduces bit line capacitance, which can reduce the storage capacitance of the memory cell.

[NOSRAM]

FIG. 11D to FIG. 11G each illustrate a circuit structure example of a gain-cell memory cell including two transistors and one capacitor. A memory cell 1474 illustrated in FIG. 11D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL, and a second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a high-level potential is preferably applied to the wiring CAL. In the time of data retaining, a low-level potential is preferably applied to the wiring CAL. The wiring BGL functions as a wiring for applying a potential to the back gate of the transistor M2. The threshold voltage of the transistor M2 can be increased or decreased by applying a given potential to the wiring BGL.

Figure 11D:
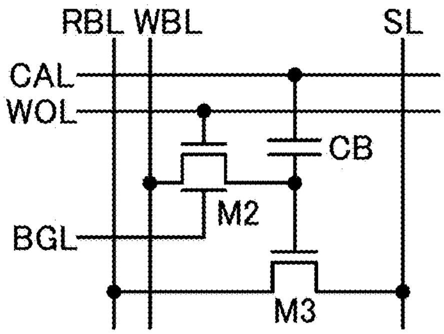
Figure 11E:
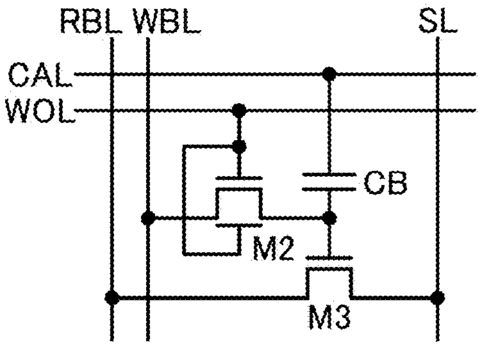
Figure 11F:
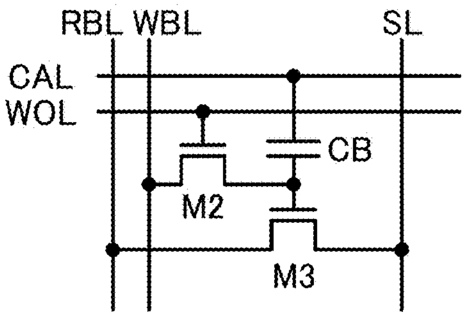
Figure 11G:
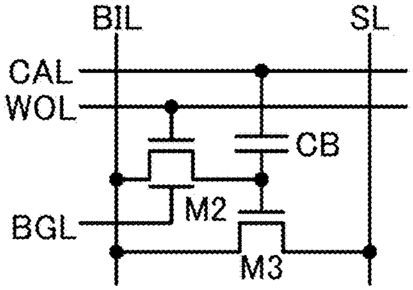

Here, the memory cell 1474 shown in FIG. 11D corresponds to the storage device shown in FIG. 8. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The circuit structure of the memory cell MC is not limited to that of the memory cell 1474, and the circuit structure can be changed as appropriate. For example, in the memory cell MC, the back gate of the transistor M2 may be connected to the wiring WOL instead of the wiring BGL as in a memory cell 1475 illustrated in FIG. 11E. As another example, the memory cell MC may be configured with a single-gate transistor, that is, the transistor M2 that does not have a back gate, like a memory cell 1476 illustrated in FIG. 11F. As another example, the memory cell MC may have a structure in which the wiring WBL and the wiring RBL are combined into one wiring BIL as in a memory cell 1477 illustrated in FIG. 11G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with use of the transistor M2, written data can be retained for a long time, and thus the frequency of the refresh operation for the memory cell can be decreased. Alternatively, refresh operation for the memory cell can be unnecessary. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, sometimes referred to as a Si transistor). The Si transistor may be either an n-channel transistor or a p-channel transistor. A Si transistor has higher field-effect mobility than an OS transistor in some cases. Therefore, a Si transistor may be used as the transistor M3 functioning as a reading transistor. Furthermore, the transistor M2 can be stacked over the transistor M3 when a Si transistor is used as the transistor M3, in which case the area occupied by the memory cell can be reduced, leading to high integration of the storage device.

Alternatively, the transistor M3 may be an OS transistor. When an OS transistor is used as each of the transistor M2 and the transistor M3, the circuit of the memory cell array 1470 can be formed using only n-channel transistors.

Figure 11H:
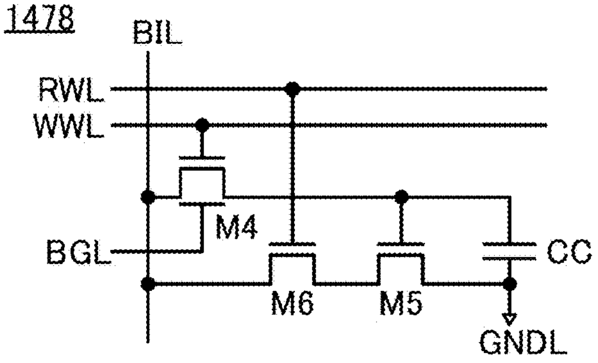

FIG. 11H illustrates an example of a gain-cell memory cell of one capacitor for three transistors. A memory cell 1478 illustrated in FIG. 11H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate, and the back gate is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in any of the above embodiments is used in the memory cell 1478, the transistor 200 can be used as the transistor M4, the transistors 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed. The storage device of one embodiment of the present invention operates fast and can retain data for a long time.

The structure, method, and the like described in this embodiment can be used in an appropriate combination with any of other structures, methods, and the like described in this embodiment or the other embodiments.

Embodiment 5

In this embodiment, an example of a chip 1200 on which the semiconductor device of the present invention is mounted will be described with reference to FIG. 12A and FIG. 12B. A plurality of circuits (systems) are mounted on the chip 1200. A technique for integrating a plurality of circuits (systems) into one chip is referred to as system on chip (SoC) in some cases.

Figure 12A:
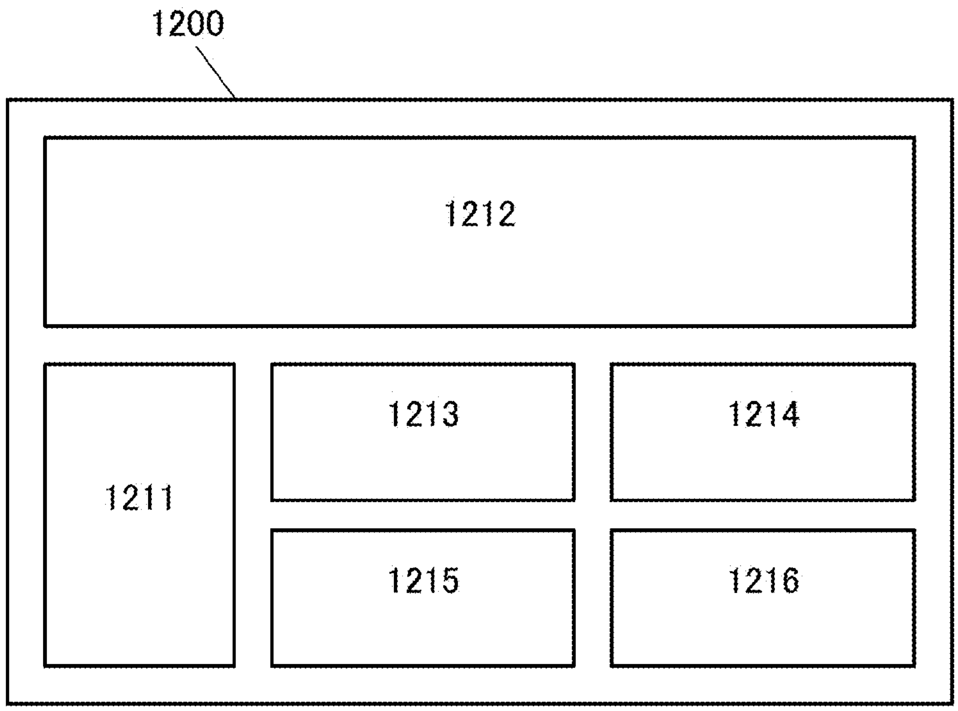
FIG. 12A and FIG. 12B are schematic views of a semiconductor device of one embodiment of the present invention.

As illustrated in FIG. 12A, the chip 1200 includes a CPU 1211, a GPU 1212, one or more analog arithmetic units 1213, one or more memory controllers 1214, one or more interfaces 1215, one or more network circuits 1216, and the like.

Figure 12B:
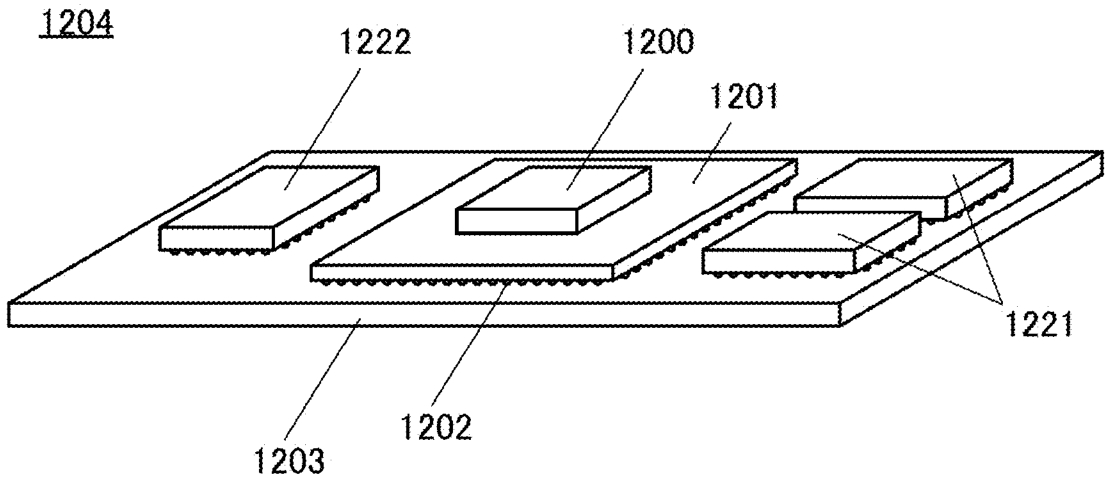

A bump (not illustrated) is provided on the chip 1200, and as illustrated in FIG. 12B, the chip 1200 is connected to a first surface of a package board 1201. In addition, a plurality of bumps 1202 are provided on a rear side of the first surface of the package board 1201, and the package board 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit and a product-sum operation circuit using an oxide semiconductor of the present invention are provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the package board 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

At least part of the structure, method, and the like described in this embodiment can be implemented in appropriate combination with any of those in the other embodiments and the other example described in this specification.

Embodiment 6

In this embodiment, examples of electronic components and electronic devices in which the storage device or the like described in the above embodiment is incorporated are described.

<Electronic Component>

Figure 13A:
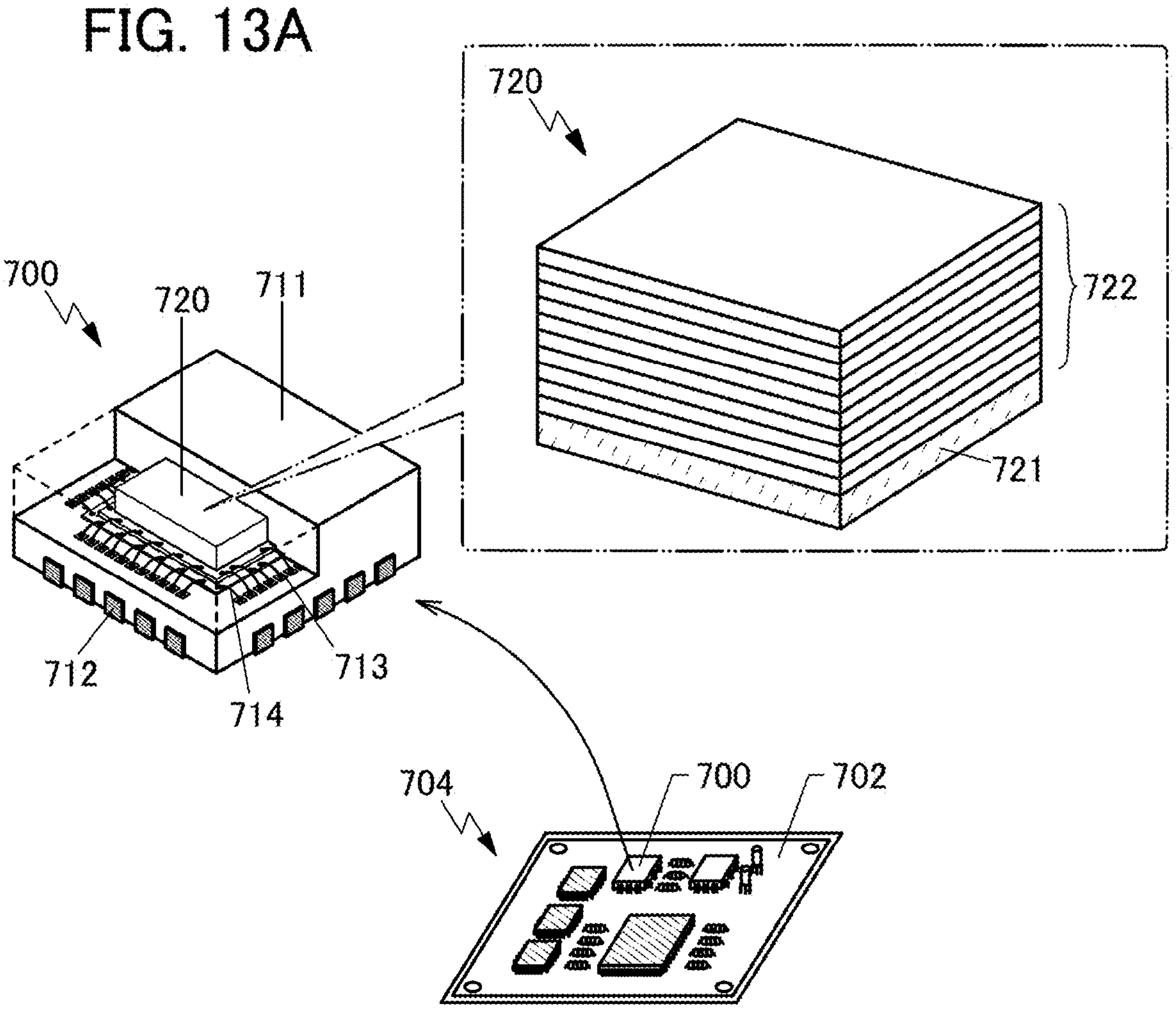
FIG. 13A and FIG. 13B are diagrams of examples of electronic components.
Figure 13B:
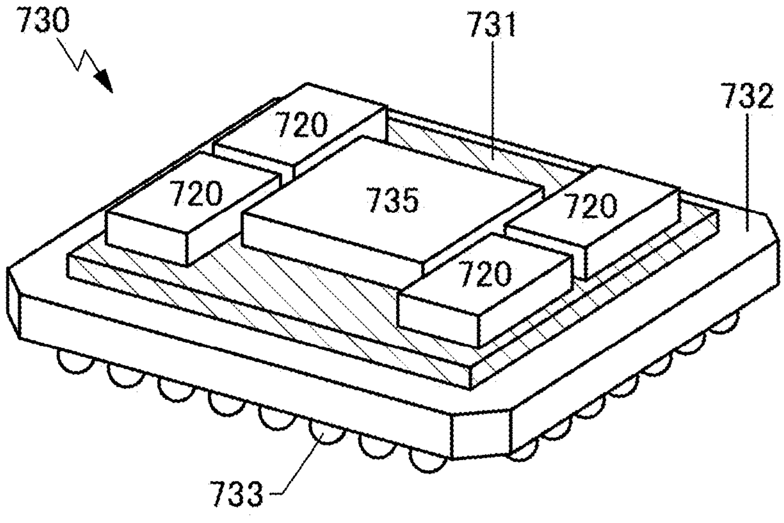

First, FIG. 13A and FIG. 13B illustrate examples of an electronic component including a storage device 720.

FIG. 13A is a perspective view of an electronic component 700 and a substrate (circuit board 704) on which the electronic component 700 is mounted. The electronic component 700 in FIG. 13A includes the storage device 720 in a mold 711. FIG. 13A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a storage circuit layer 722.

FIG. 13B is a perspective view of an electronic component 730. The electronic component 730 is an example of a SiP (System in package) or an MCM (Multi Chip Module). In the electronic component 730, an interposer 731 is provided over a package board 732 (printed circuit board)

and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package board 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. The interposer 731 has a function of electrically connecting an integrated circuit provided on the interposer 731 to an electrode provided on the package board 732. Accordingly, the interposer is referred to as a "redistribution substrate" or an "intermediate substrate" in some cases. A through electrode may be provided in the interposer 731 to be used for electrically connecting the integrated circuit and the package board 732. In a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (radiator plate) may be provided to overlap the electronic component 730.

In the case of providing a heat sink, the heights of integrated circuits provided on the interposer 731 are preferably the same. In the electronic component 730 of this embodiment, the heights of the storage device 720 and the semiconductor device 735 are preferably the same, for example.

An electrode 733 may be provided on the bottom portion of the package board 732 to mount the electronic component 730 on another substrate. FIG. 13B illustrates an example in which the electrode 733 is formed of a solder ball. Solder balls are provided in a matrix on the bottom portion of the package board 732, whereby a BGA (Ball Grid Array) can be achieved. Alternatively, the electrode 733 may be formed of a conductive pin. When conductive pins are provided in a matrix on the bottom portion of the package board 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

The structure, method, and the like described in this embodiment can be used in an appropriate combination with any of other structures, methods, and the like described in this embodiment or the other embodiments.

Embodiment 7

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 14A to FIG. 14E schematically illustrate some structure examples of removable memory devices. The semiconductor device described in the above embodiment is processed into a packaged memory chip and used in a variety of storage devices and removable memories, for example.

Figure 14A:
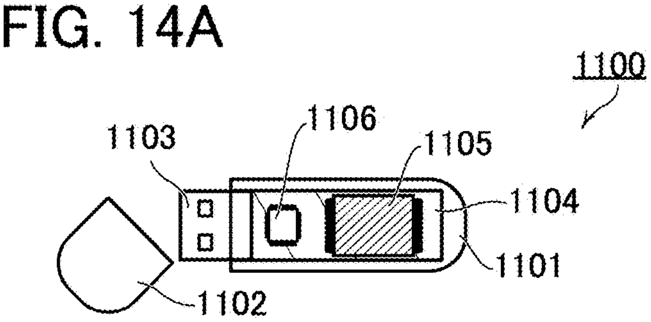
FIG. 14A to FIG. 14E are schematic views of storage devices of one embodiment of the present invention.

FIG. 14A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 14B:
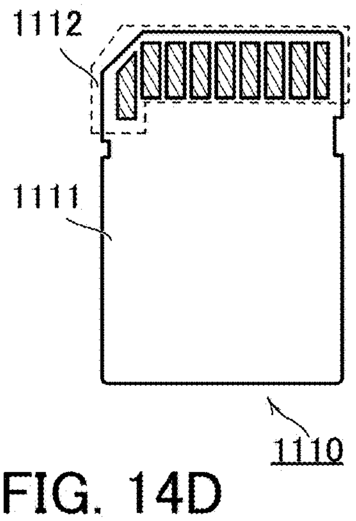
Figure 14C:
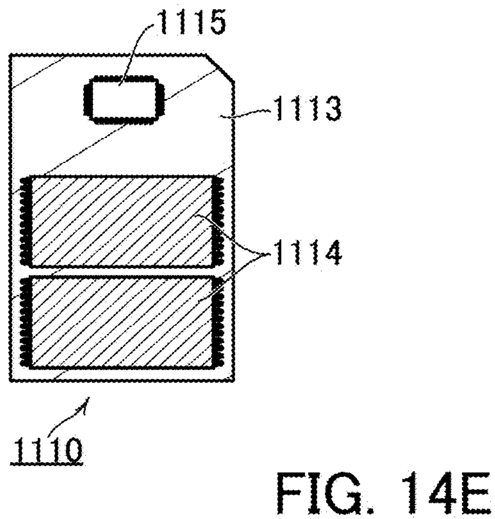

FIG. 14B is a schematic external view of an SD card, and FIG. 14C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 14D:
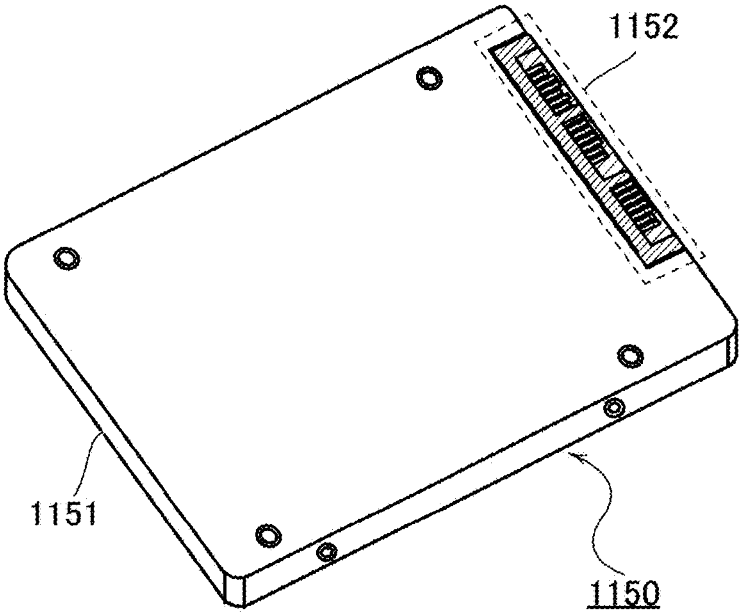
Figure 14E:
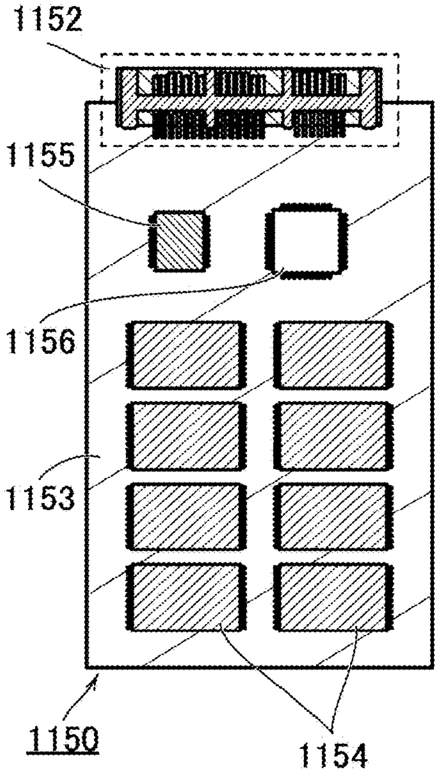

FIG. 14D is a schematic external view of an SSD, and FIG. 14E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

At least part of the structure, method, and the like described in this embodiment can be implemented in appropriate combination with any of those in the other embodiments and the other example described in this specification.

Embodiment 8

The semiconductor device of one embodiment of the present invention can be used as a processor such as a CPU and a GPU or a chip. FIG. 15A to FIG. 15H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, information, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 15A to FIG. 15H illustrate examples of electronic devices.

[Information Terminal]

Figure 15A:
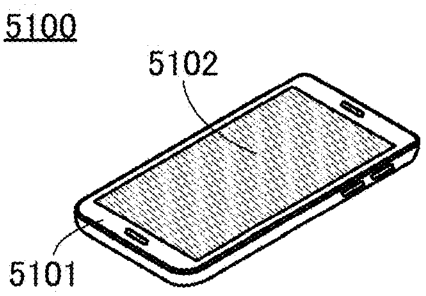
FIG. 15A to FIG. 15H are diagrams illustrating electronic devices of one embodiment of the present invention.

FIG. 15A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 15B:
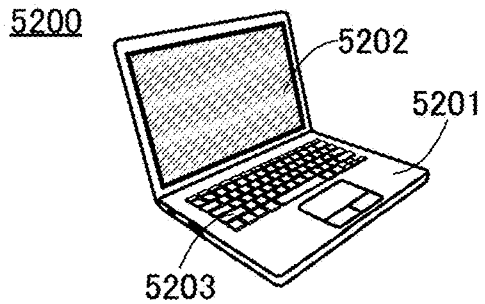

FIG. 15B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 15A and FIG. 15B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 15C:
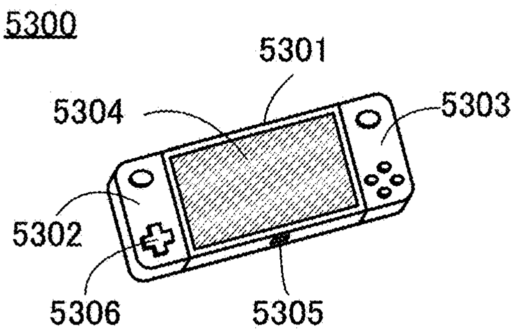

FIG. 15C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 15D:
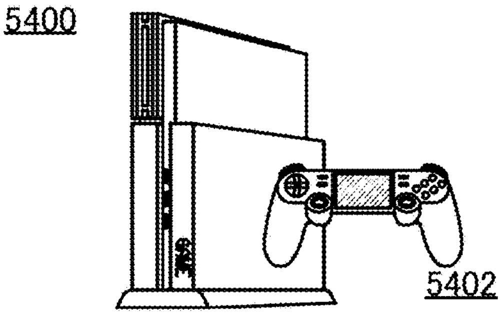

FIG. 15D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the GPU or the chip of one embodiment of the present invention is applied to the portable game machine 5300, the portable game machine 5300 including AI can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 15C and FIG. 15D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 15E:
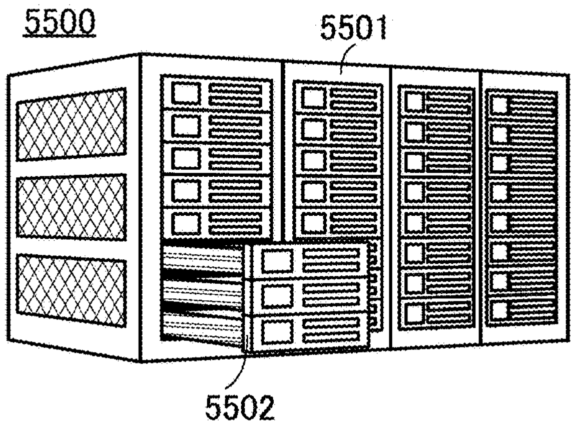
Figure 15F:
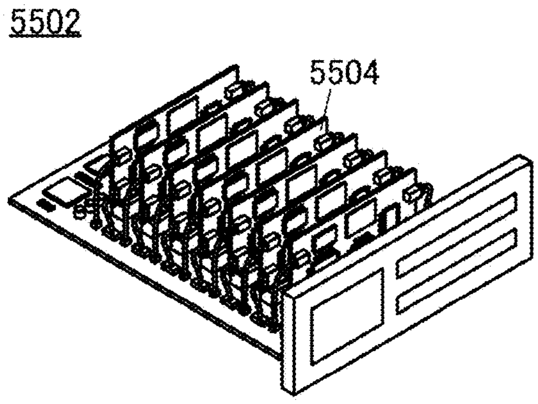

FIG. 15E is a diagram illustrating a supercomputer 5500 as an example of a large computer. FIG. 15F is a diagram illustrating a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is shown as an example of a large computer in FIG. 15E and FIG. 15F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 15G:
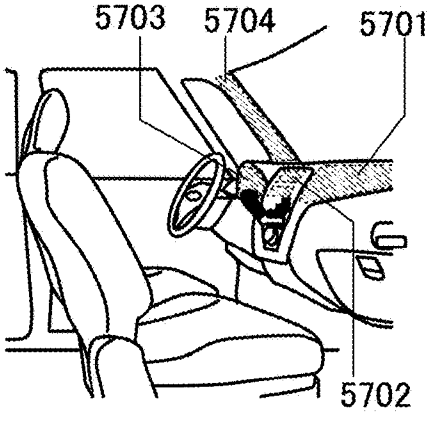

FIG. 15G illustrates an area around a windshield inside an automobile, which is an example of a moving vehicle. FIG. 15G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 15H:
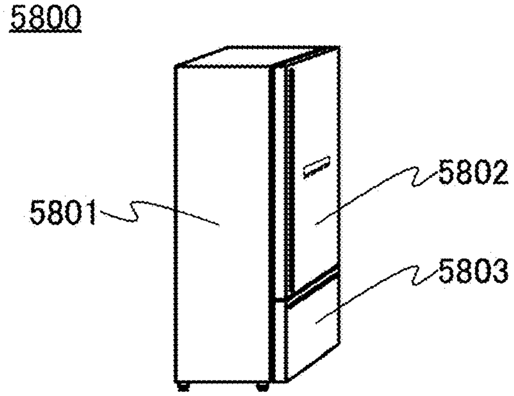

FIG. 15H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments and the other example described in this specification.

EXAMPLE

In this example, transistors described in the above embodiment were fabricated, and electrical characteristics thereof were measured.

In this example, Sample 1 including transistors each having a structure similar to that of the transistor 200 illustrated in FIG. 4, which were arranged at a density of 2.0/$\mu m^2$, was fabricated, and the electrical characteristics of Samples 1 were measured. Different from the transistor 200 illustrated in FIG. 4, each of the transistors of Sample 1 includes the insulator 212 with a single-layer structure. Each of the transistors of Sample 1 includes the insulator 250 with a stacked structure of the insulator 250*a* and the insulator 250*b* as illustrated in FIG. 5B.

As the insulator 212, 60-nm-thick silicon nitride was used. The insulator 212 was deposited by a pulsed DC sputtering method using a silicon target. In the deposition of the insulator 212, an argon gas at 30 sccm (25 sccm from a first gas supply port and 5 sccm from a second gas supply port) and a nitrogen gas at 85 sccm were used as deposition gases; the deposition pressure was 0.5 Pa; the substrate temperature was 200° C.; and the target-substrate distance was 62 mm. As for a pulsed DC power source, the power was 1 kW, the frequency was 100 kHz, and the off time in one cycle was 4016 nsec.

As the insulator 214, 40-nm-thick aluminum oxide deposited by a sputtering method was used. In the deposition of the insulator 214, deposition to 5 nm was performed without application of a bias power and then deposition to 35 nm was performed with application of a bias power of 50 W. For the insulator 216, 130-nm-thick silicon oxide deposited by a sputtering method was used. The insulator 212, the insulator 214, and the insulator 216 were successively deposited without exposure to the air using a multi-chamber sputtering apparatus.

As the conductor 205*a*, titanium nitride deposited by a metal CVD method was used. As the conductor 205*b*, tungsten deposited by a metal CVD method was used.

As the insulator 222, 20-nm-thick hafnium oxide deposited by an ALD method was used. As the insulator 224, 20-nm-thick silicon oxide deposited by a sputtering method was used.

As the oxide 230*a,* 10-nm-thick In—Ga—Zn oxide deposited by a DC sputtering method was used. In the deposition of the oxide 230*a*, a target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 300° C.; and the target-substrate distance was 60 mm. The insulator 224 and the oxide 230*a* were successively deposited without exposure to the air using a multi-chamber sputtering apparatus.

As the oxide 230*b,* 15-nm-thick In—Ga—Zn oxide deposited by a DC sputtering method was used. In the deposition of the oxide 230*b*, a target with In:Ga:Zn=1:1:2 [atomic ratio] was used; an oxygen gas at 45 sccm was used as a deposition gas; the deposition pressure was 0.4 Pa; the deposition power was 200 W; the substrate temperature was 300° C.; and the target-substrate distance was 130 mm.

Note that after the oxide film to be the oxide 230*b* was formed, heat treatment was performed at 450° C. for an hour with use a nitrogen gas at 4 slm and an oxygen gas at 1 slm.

As the conductor 242, 20-nm-thick tantalum nitride deposited by a sputtering method was used. As the insulator 271, 5-nm-thick aluminum oxide deposited by a sputtering method was used. As the insulator 275, a stacked film of 5-nm-thick aluminum oxide deposited by a sputtering method and 5-nm-thick silicon nitride deposited thereover by a PEALD method was used. The insulator 280 was deposited to have a stacked film of silicon oxide deposited by a sputtering method and silicon nitride deposited sequentially thereover.

As the insulator 252, 1-nm-thick aluminum oxide deposited by an ALD method was used. As the insulator 250*a,* 5-nm-thick silicon oxynitride deposited by a CVD method was used. As the insulator 250*b,* 1.5-nm-thick hafnium oxide deposited by an ALD method was used. As the insulator 254, 1-nm-thick silicon nitride deposited by a PEALD method was used.

As the conductor 260*a,* 5-nm-thick titanium nitride deposited by a metal CVD method was used. As the conductor 260*b*, tungsten deposited by a metal CVD method was used.

As the insulator 282, 40-nm-thick aluminum oxide deposited by a sputtering method was used. Note that in the deposition of the insulator 282, deposition to 5 nm thickness was performed with application of a bias power of 300 W and then deposition to 35 nm was performed with application of a bias power of 100 W.

As the insulator 283, 25-nm-thick silicon nitride deposited by a sputtering method was used. As the insulator 288, 5-nm-thick silicon nitride deposited by a PEALD method was used. As the insulator 274, silicon oxynitride deposited by an APCVD method was used. Here, the insulator 283, the insulator 288, and the insulator 274 were subjected to CMP treatment until an uppermost portion of the insulator 283 was exposed. Thus, the upper uppermost portions of the insulator 283, the insulator 288, and the insulator 274 were substantially aligned with each other.

As the insulator 285, 50-nm-thick silicon oxide deposited by a sputtering method was used. An opening reaching the conductor 242 was formed in the insulator 285, the insulator 283, the insulator 280, the insulator 275, and the insulator 271, and the insulator 241 and the conductor 240 are provided in the opening. The insulator 241 consists of 5-nm-thick aluminum oxide deposited by an ALD method, which is in contact with the side surface of the opening, and 5-nm-thick silicon nitride deposited by a PEALD method, which is in contact with the inner side of the aluminum oxide. The conductor 240 consists of 5-nm-thick titanium nitride deposited by a metal CVD method, which is in contact with the inner side of the insulator 241, and 5-nm-thick tungsten deposited by a metal CVD method, which is in contact with the inner side of the titanium nitride.

The conductor 246 is provided in contact with the top surfaces of the conductor 240, the insulator 241, and the insulator 285. As the conductor 246, 50-nm-thick tungsten deposited by a sputtering method was used.

The insulator 286*a* is provided to cover the conductor 240 and the insulator 285. As the insulator 286*a,* 10-nm-thick silicon nitride deposited by a sputtering method was used. The insulator 286*a* was deposited by a pulsed DC sputtering method using a silicon target. In the deposition of the insulator 286*a*, an argon gas at 30 sccm (25 sccm from a first gas supply port and 5 sccm from a second gas supply port) and a nitrogen gas at 85 sccm were used as deposition gases; the deposition pressure was 0.5 Pa; the substrate temperature was 200° C.; and the target-substrate distance was 62 mm. As for a pulsed DC power source, the power was 1 kW, the frequency was 100 kHz, and the off time in one cycle was 4016 nsec. Before the deposition of the insulator 286*a*, heat treatment was performed in reduced pressure at 350° C. for 5 minutes, and deposition treatment for the insulator 286*a* was performed successively without exposure to the air.

The insulator 286*b* is provided to cover the insulator 286*a*. As the insulator 286*b,* 5-nm-thick silicon nitride deposited by a PEALD method was used. For the deposition of the insulator 286$b$, while a nitrogen gas was introduced into a chamber, a set of a step of introducing an inorganic silicon precursor and a step of applying plasma with a frequency of 13.56 MHz was repeatedly performed. The insulator 286$b$ was deposited at a substrate temperature of 350° C.

Sample 1 having the above-described structure is a transistor with the following designed values: a channel length of 60 nm and a channel width of 60 nm. Although not illustrated in the transistor 200 in FIG. 4, a 1.4-μm-thick polyimide film is provided over the insulator 286 in Sample 1. After the fabrication, Sample 1 was subjected to heat treatment at 400° C. for 8 hours in a nitrogen atmosphere.

The $I_d$-$V_g$ characteristics (drain current-gate voltage characteristics) of nine elements of Sample 1 fabricated as described above were measured using a semiconductor parameter analyzer manufactured by Keysight Technologies. The $I_d$-$V_g$ characteristics were measured under the conditions where the drain potential $V_d$ was 0.1 V or 1.2 V; the source potential $V_s$ was 0 V; the bottom gate potential $V_{bg}$ was 0 V; and the top gate potential $V_g$ was swept from −4.0 V to 4.0 V in increments of 0.1 V.

Figure 16:
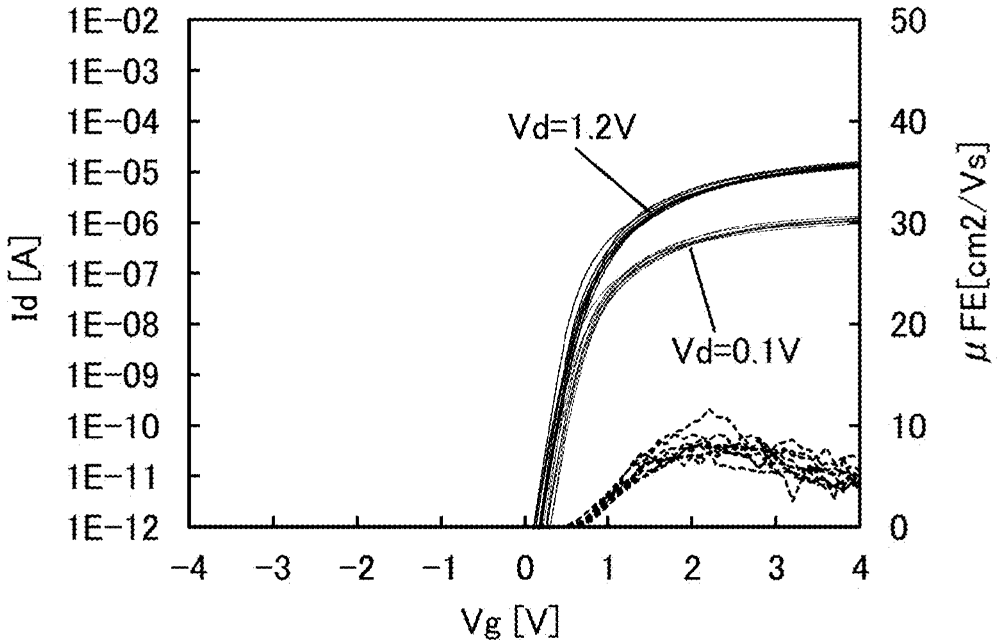
FIG. 16 is a graph relating to one example of the present invention.

FIG. 16 shows the measurement results of $I_d$-$V_g$ characteristics of Sample 1. In FIG. 16, the horizontal axis represents top gate potential $V_g$ (V), the first vertical axis represents drain current $I_d$ (A), and the second vertical axis represents field-effect mobility $\mu_{FE}$ (cm$^2$/Vs) at $V_d$=0.1 V. The drain current at $V_d$ of 0.1 V is shown by a thin solid line, the drain current at $V_d$ of 1.2 V is shown by a thick dashed line, and the field-effect mobility at $V_d$ of 0.1 V is shown by a dashed line. As shown in FIG. 16, all of the 9 elements of Sample 1 (the transistors described in this example) showed favorable electrical characteristics.

Furthermore, shift voltages $V_{sh}$ of the 9 elements were calculated from the above $I_d$-$V_g$ measurement results, and the median value and the standard deviation a thereof were obtained. Here, the shift voltage $V_{sh}$ is defined as, in the $I_d$-$V_g$ curve of the transistor, $V_g$ at which the tangent at a point where the slope of the curve is the steepest intersects the straight line of $I_d$=1 pA. The median value of the shift voltage $V_{sh}$ was 0.17 V and the standard deviation of the shift voltage $V_{sh}$ was 36 mV, which were favorable values.

In this manner, with the insulator 286 having a barrier property against impurities such as hydrogen, transistors with favorable electrical characteristics and a small variation in transistor characteristics in a substrate plane can be provided.

At least parts of the structure, the method, and the like shown in this example can be implemented in appropriate combination with other embodiments, other examples, and the like described in this specification.

REFERENCE NUMERALS

M1: transistor, M2: transistor, M3: transistor, M4: transistor, M5: transistor, M6: transistor, 10: semiconductor device, 11: insulator, 11$a$: insulator, 11$b$: insulator, 12: oxide semiconductor element, 13: element layer, 14: conductor, 15: conductor, 15A: conductive film, 18: insulator, 18$a$: insulator, 18$b$: insulator, 19: opening, 100: capacitor, 110: conductor, 112: conductor, 120: conductor, 130: insulator, 150: insulator, 158: conductor, 160: insulator, 162: conductor, 164: insulator, 166: conductor, 168: insulator, 168$a$: insulator, 168$b$: insulator, 200: transistor, 205: conductor, 205$a$: conductor, 205$b$: conductor, 210: insulator, 212: insulator, 212$a$: insulator, 212$b$: insulator, 214: insulator, 216: insulator, 217: insulator, 218: conductor, 222: insulator, 224: insulator, 230: oxide, 230$a$: oxide, 230$b$: oxide, 230$ba$: region, 230$bb$: region, 230$bc$: region, 240: conductor, 240$a$: conductor, 240$b$: conductor, 241: insulator, 241$a$: insulator, 241$b$: insulator, 242: conductor, 242$a$: conductor, 242$b$: conductor, 246: conductor, 246$a$: conductor, 246$b$: conductor, 250: insulator, 250$a$: insulator, 250$b$: insulator, 252: insulator, 254: insulator, 260: conductor, 260$a$: conductor, 260$b$: conductor, 265: sealing portion, 271: insulator, 271$a$: insulator, 271$b$: insulator, 274: insulator, 275: insulator, 280: insulator, 282: insulator, 283: insulator, 285: insulator, 286: insulator, 286$a$: insulator, 286$b$: insulator, 287: insulator, 288: insulator, 300: transistor, 311: substrate, 313: semiconductor region, 314$a$: low-resistance region, 314$b$: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: opening region, 500: semiconductor device, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package board, 733: electrode, 735: semiconductor device, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: package board, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A method for manufacturing a semiconductor device comprising the steps of:

forming an opening in a structure body comprising an oxide semiconductor device to reach the oxide semiconductor device;

embedding a first conductor in the opening;

forming a second conductor in contact with a top surface of the first conductor;

forming a first barrier insulating film by a sputtering method to cover the structure body, the first conductor, and the second conductor; and forming a second barrier insulating film over the first barrier insulating film by an ALD method, wherein a bottom surface of the first barrier insulating film faces the oxide semiconductor device, wherein the first barrier insulating film is in contact with a top surface and a side surface of the second conductor, wherein a thickness of the first barrier insulating film is larger than a thickness of the second barrier insulating film, and wherein the first barrier insulating film and the second barrier insulating film are each configured to inhibit hydrogen diffusion.

2. The method for manufacturing a semiconductor device according to claim 1, wherein the first barrier insulating film comprises silicon nitride.

3. The method for manufacturing a semiconductor device according to claim 1, wherein the second barrier insulating film comprises silicon nitride.

4. The method for manufacturing a semiconductor device according to claim 1, wherein a hydrogen concentration of the first barrier insulating film is lower than a hydrogen concentration of the second barrier insulating film.

5. The method for manufacturing a semiconductor device according to claim 1, wherein the second barrier insulating film is formed by a PEALD method.

6. The method for manufacturing a semiconductor device according to claim 1, wherein a precursor not containing an organic substance is used for the formation of the second barrier insulating film.

7. A method for manufacturing a semiconductor device comprising the steps of:

forming an opening in a structure body comprising an oxide semiconductor device to reach the oxide semiconductor device;

embedding a first conductor in the opening;

forming a second conductor in contact with a top surface of the first conductor;

forming a first barrier insulating film by a sputtering method to cover the structure body, the first conductor, and the second conductor;

forming a second barrier insulating film over the first barrier insulating film by an ALD method;

forming a third barrier insulating film by an ALD method; and forming a fourth barrier insulating film over the third barrier insulating film by a sputtering method, wherein a bottom surface of the first barrier insulating film faces the oxide semiconductor device, wherein the first barrier insulating film is in contact with a top surface and a side surface of the second conductor, wherein a thickness of the first barrier insulating film is larger than a thickness of the second barrier insulating film, and wherein a top surface of the fourth barrier insulating film comprises a region facing the bottom surface of the first barrier insulating film with the oxide semiconductor device sandwiched therebetween, wherein the formation of the third barrier insulating film and the formation of the fourth barrier insulating film are performed before the step of forming the structure body, and wherein the first barrier insulating film, the second barrier insulating film, the third barrier insulating film, and the fourth barrier insulating film are each configured to inhibit hydrogen diffusion.

8. The method for manufacturing a semiconductor device according to claim 7, wherein the first barrier insulating film comprises silicon nitride.

9. The method for manufacturing a semiconductor device according to claim 7, wherein the second barrier insulating film comprises silicon nitride.

10. The method for manufacturing a semiconductor device according to claim 7, wherein a hydrogen concentration of the first barrier insulating film is lower than a hydrogen concentration of the second barrier insulating film.

11. The method for manufacturing a semiconductor device according to claim 7, wherein the second barrier insulating film is formed by a PEALD method.

12. The method for manufacturing a semiconductor device according to claim 7, wherein a precursor not containing an organic substance is used for the formation of the second barrier insulating film.

13. The method for manufacturing a semiconductor device according to claim 7, wherein the third barrier insulating film comprises silicon nitride.

14. The method for manufacturing a semiconductor device according to claim 7, wherein the fourth barrier insulating film comprises silicon nitride.

15. The method for manufacturing a semiconductor device according to claim 7, wherein a hydrogen concentration of the fourth barrier insulating film is lower than a hydrogen concentration of the third barrier insulating film.

16. The method for manufacturing a semiconductor device according to claim 7, wherein the third barrier insulating film is formed by a PEALD method.

17. The method for manufacturing a semiconductor device according to claim 7, wherein a precursor not containing an organic substance is used for the formation of the third barrier insulating film.

18. The method for manufacturing a semiconductor device according to claim 7, wherein an oxide semiconductor film included in the oxide semiconductor device is formed by a sputtering method using a target comprising one or more selected from In, Ga, and Zn.

19. The method for manufacturing a semiconductor device according to claim 1, wherein an oxide semiconductor film included in the oxide semiconductor device comprises an indium oxide.

* * * * *